(12) United States Patent
Roy Chowdhury et al.

(10) Patent No.: US 12,713,673 B2
(45) Date of Patent: Aug. 18, 2026

(54) BACKSIDE CONTACT WITH FULL WRAP-AROUND CONTACT

(71) Applicant: INTERNATIONAL BUSINESS MACHINES CORPORATION, Armonk, NY (US)

(72) Inventors: Prabudhya Roy Chowdhury, Albany, NY (US); Nikhil Jain, Apple Valley, MN (US); Kisik Choi, Watervliet, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 449 days.

(21) Appl. No.: 17/943,602

(22) Filed: Sep. 13, 2022

(65) Prior Publication Data

US 2024/0088233 A1 Mar. 14, 2024

(51) Int. Cl.

*H10D 64/01* (2025.01)
*H10D 30/01* (2025.01)
*H10D 30/43* (2025.01)
*H10D 30/67* (2025.01)
*H10D 64/62* (2025.01)
*H10W 20/41* (2026.01)

(52) U.S. Cl.

CPC ........... *H10D 64/01* (2025.01); *H10D 30/014* (2025.01); *H10D 30/031* (2025.01); *H10D 30/43* (2025.01); *H10D 30/6729* (2025.01); *H10D 30/6735* (2025.01); *H10D 64/62* (2025.01); *H10W 20/427* (2026.01)

(58) Field of Classification Search

CPC .... H10D 64/01; H10D 30/014; H10D 30/031; H10D 30/43; H10D 30/6729; H10D 30/6735; H10D 64/62; H10D 30/6757; H10D 62/121; H10D 62/151; H10D 64/251; H10D 64/256; H10D 64/254; H01L 23/5286; H01L 21/28518; H01L 21/76897

See application file for complete search history.

(56) References Cited

U.S. PATENT DOCUMENTS

| | | | |
|---|---|---|---|
| 9,570,395 | B1 | 2/2017 | Sengupta et al. |
| 10,586,765 | B2 | 3/2020 | Smith et al. |
| 10,636,739 | B2 | 4/2020 | Beyne et al. |
| 10,658,483 | B2 | 5/2020 | Leobandung et al. |
| 10,700,207 | B2 | 6/2020 | Chen et al. |
| 10,734,224 | B2 | 8/2020 | Smith et al. |
| 10,797,139 | B2 | 10/2020 | Morrow et al. |
| 10,957,575 | B2 | 3/2021 | Yakimets et al. |
| 11,189,713 | B2 | 11/2021 | Xie et al. |
| 11,264,493 | B2 | 3/2022 | Morrow et al. |
| 2020/0075574 | A1 | 3/2020 | Smith et al. |
| 2020/0105671 | A1 | 4/2020 | Lal et al. |

(Continued)

FOREIGN PATENT DOCUMENTS

WO WO2021259479 A1 12/2021

*Primary Examiner* — Mohammad A Rahman
(74) *Attorney, Agent, or Firm* — Harrity & Harrity, LLP

(57) ABSTRACT

A semiconductor device includes a source/drain having a height, a length, and a width. A full wrap-around contact surrounds a partial length of the source/drain, wherein the full wrap-around contact includes a partial front-side wrap-around contact from a front side of a substrate and a partial back-side wrap-around contact from a back side of the substrate.

20 Claims, 22 Drawing Sheets

(56) References Cited

U.S. PATENT DOCUMENTS

| | | | | |
|---|---|---|---|---|
| 2021/0111115 | A1 | 4/2021 | Morrow et al. | |
| 2021/0134721 | A1 | 5/2021 | Chiang et al. | |
| 2021/0202385 | A1 | 7/2021 | Huang et al. | |
| 2021/0336019 | A1 | 10/2021 | Su et al. | |
| 2022/0190161 | A1* | 6/2022 | Miller | H10D 30/6211 |
| 2024/0079465 | A1* | 3/2024 | Cheng | H01L 21/28518 |

* cited by examiner

A
A
B
B
162
152
162
152
147
180
132
130
120
110
190
162
162
152
152
147
132
120
110
200
200
200
190
A
A
B
B

A
A
B
B
220
180
230
132
120
110
B
B
190
164
164
154
154
210
230
134
132
120
110
200
220
200
220
230
190
220
A
A 220
190
270
190
270
260
190
164
250
154
250
210
240
134
132
120
110
A
A
270
260
220
180
240
132
120
110
B
B

A
A
B
B
290
260
220
270
180
240
132
120
110
B
B
280
164
164
220
154
210
240
134
132
120
110
220
290
270
290
280
A
A 280
290
260
290
280
300
280
164
164
220
154
210
240
134
132
120
110
A
A
300
290
260
220
270
180
240
132
120
110
B
B 330
320
310
300
290
260
220
270
180
240
132
120
110
B
B
330
320
310
300
280
220
164
164
154
210
240
134
132
120
110
A
A 340
260
260
240
210
164
164
220
280
300
310
320
330
A
A
220
220
340
180
220
270
290
260
300
310
320
330
B
B 340
260
260
340
210
164
164
220
280
300
310
320
330
A
A
225
180
340
260
225
260
340
180
220
270
290
260
300
310
320
330
B
B 340
350
350
340
210
164
164
220
280
300
310
320
330
A
A
350
180
340
260
350
350
340
180
350
270
290
260
300
310
320
330
B
B 340
350
350
340
210
164
164
220
280
300
310
320
330
A
A
350
180
340
260
350
350
340
180
350
270
290
260
300
310
320
330
B
B 390
380
360
340
350
210
164
164
220
280
300
310
320
330
370
A
A
380
370
380
390
360
340
180
350
270
290
260
300
310
320
330
B
B

BACKSIDE CONTACT WITH FULL WRAP-AROUND CONTACT

BACKGROUND

The present invention generally relates to a back-side power distribution network (BSPDN) contacts, and more particularly to backside power rail (BPR) connection.

As a micro-through silicon via (μTSV) diameter increases, the keep-out-zone (KOZ) also increases. Through silicon vias (TSVs) can be formed during fabrication as a way of providing a conductive path through silicon.

SUMMARY

In accordance with an embodiment of the present invention, a method of forming a semiconductor device includes forming an adjacent pair of insulating sidewalls on a stack of alternating sacrificial nanosheet sections and semiconductor nanosheet layer sections; removing a portion of the sacrificial nanosheet sections and semiconductor nanosheet layer sections between the adjacent pair of insulating sidewalls, and an underlying active semiconductor mesa to form a mesa cavity, and a stack of alternating sacrificial nanosheet segments and semiconductor nanosheet layer segments; forming a sacrificial plug in the mesa cavity; forming a source/drain on the sacrificial plug, wherein insulating sidewalls are on opposite sides of the source/drain; forming a metal-silicide layer on the source/drain; inverting the source/drain, metal-silicide layer, and sacrificial plug, so the sacrificial plug is on top; forming a backside ILD layer on the sacrificial plug; removing the sacrificial plug and a portion of the backside ILD layer to expose the source/drain and insulating sidewalls on opposite sides of the source/drain; and forming a backside conductive contact around the source/drain and in electrical contact with the metal-silicide layer to form a full wrap-around contact.

In accordance with another embodiment of the present invention, a semiconductor device includes a source/drain having a height, a length, and a width; and a full wrap-around contact surrounding at least a partial length of the source/drain, wherein the full wrap-around contact includes a partial front-side wrap-around contact from a front side of a substrate and a partial back-side wrap-around contact from a back side of the substrate.

In accordance with yet another embodiment of the present invention, a backside power connection device includes a back-end-of-line metallization layer on a carrier wafer; an interlevel dielectric (ILD) layer on the back-end-of-line metallization layer; a first gate contact, a first source/drain contact, and a second source/drain contact in the ILD layer, and in electrical contact with the back-end-of-line metallization layer; a first source/drain on the first source/drain contact; a second source/drain on the second source/drain contact; a first replacement metal gate structure on and in electrical contact with the first gate contact; a sacrificial plug on the first source/drain opposite the first source/drain contact; and a conductive contact on and in electrical contact with the replacement metal gate structure and the second source/drain.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Principles and embodiments of the present invention relate to forming back-side electrical connections to full wrap-around source/drain contacts. Dummy sidewalls adjoining the source/drains can be removed to form contact trenches. The full wrap-around source/drain contacts can improve device performance.

In one or more embodiments, a silicide layer can form at least a portion of the full wrap-around source/drain contact, where a partial back-side wrap-around contact can be formed from a back side of a device and substrate. The partial back-side wrap-around contact can be directly on the source/drain, whereas the silicide layer can be between the partial front-side wrap-around contact and the source/drain.

In one or more embodiments, a sacrificial plug can be formed in source/drain regions of devices and removed after flipping the wafer to allow access to the backside of the source/drains and provide an opening to form the back-side electrical contacts.

In various embodiments, a backside power rail can connect to a source/drain of a transistor through a partial back-side wrap-around contact.

Exemplary applications/uses to which the present invention can be applied include, but are not limited to: digital logic structures and device (e.g., gates, central processing units, etc.) and memory structures and device (e.g., static random access memory (SRAM), dynamic random access memory (DRAM), etc.).

It is to be understood that aspects of the present invention will be described in terms of a given illustrative architecture; however, other architectures, structures, substrate materials and process features and steps can be varied within the scope of aspects of the present invention.

Figure 1:
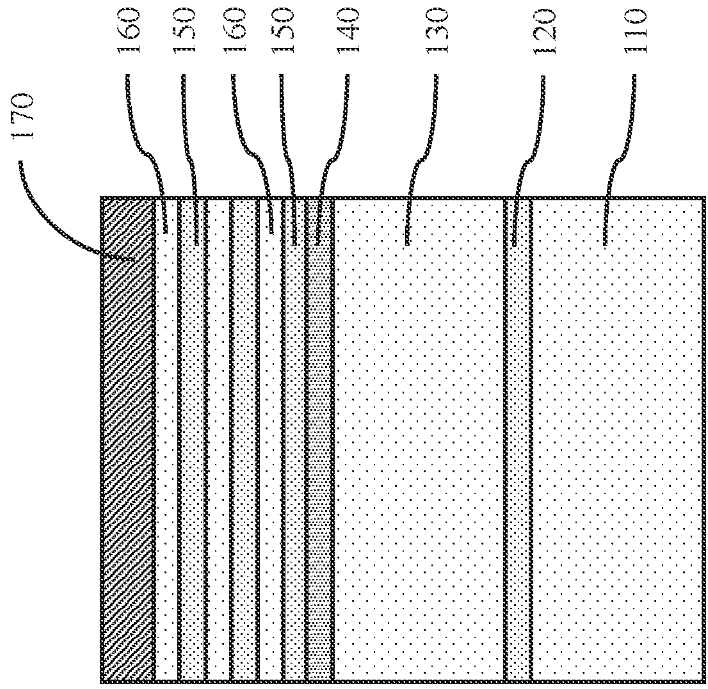
FIG. 1 is a cross-sectional side view showing alternating nanosheet layers and sacrificial layers on a substrate, in accordance with an embodiment of the present invention.

Referring now to the drawings in which like numerals represent the same or similar elements and initially to FIG. 1, FIG. 1 is a cross-sectional side view showing alternating nanosheet layers and sacrificial layers on a substrate, in accordance with an embodiment of the present invention.

In one or more embodiments, alternating sacrificial nanosheet layers 150 and semiconductor nanosheet layers 160 can be formed on a substrate 110. The sacrificial nanosheet layers 150 and semiconductor nanosheet layers 160 can be formed on a bottom sacrificial layer 140 between the sacrificial nanosheet layers 150 and semiconductor nanosheet layers 160 and an active semiconductor layer 130. A buried etch-stop layer 120 can be between the substrate 110 and the active semiconductor layer 130. In various embodiments, a masking layer 170 can be formed on the alternating sacrificial nanosheet layers 150 and semiconductor nanosheet layers 160.

In various embodiments, the substrate 110 can be a semiconductor material, for example, silicon (Si), silicon-germanium (SiGe), silicon carbide (SiC), or III-V compound semiconductor material (e.g., gallium-arsenide (GaAs)). The substrate 110 can be a semiconductor-on-insulator (SeOI) substrate, where the buried etch-stop layer 120 can be a buried electrical insulator layer (e.g., BOX layer) or a silicon-germanium partition layer (SiGe).

In various embodiments, the buried etch-stop layer 120 can be formed on the substrate 110 or between the substrate 110 and the active semiconductor layer 130, where the buried etch-stop layer 120 can be a buried oxide layer (BOX) or a buried silicon-germanium (SiGe) partition layer.

In various embodiments, the active semiconductor layer 130 can be the same semiconductor material as the substrate 110 or a different semiconductor material formed on the buried etch-stop layer 120, for example, a semiconductor material epitaxially grown on a buried silicon-germanium partition layer.

In various embodiments, the sacrificial nanosheet layers 150 can be silicon-germanium (SiGe) layers having a germanium concentration sufficient to allow selective etching and removal relative to the bottom sacrificial layer 140 and the semiconductor nanosheet layers 160. The semiconductor nanosheet layers 160 can be, for example, silicon (Si).

In various embodiments, the bottom sacrificial layer 140 can be silicon-germanium (SiGe) layers having a germanium concentration sufficient to allow selective etching and removal relative to the active semiconductor layer 130, semiconductor nanosheet layers 160, and the sacrificial layers 150. In various embodiments, the bottom sacrificial layer 140 can be silicon-germanium (SiGe) layer having a germanium concentration of greater than 50 atomic percent (at. %), whereas the sacrificial layers 150 can be silicon-germanium (SiGe) layer having a germanium concentration of less than 35 at. %.

In various embodiments, the masking layer 170 can be a hardmask, dielectric material, for example, silicon nitride, silicon boronitride, etc., where the masking layer 170 can have multiple layers of masking materials.

Figure 2:
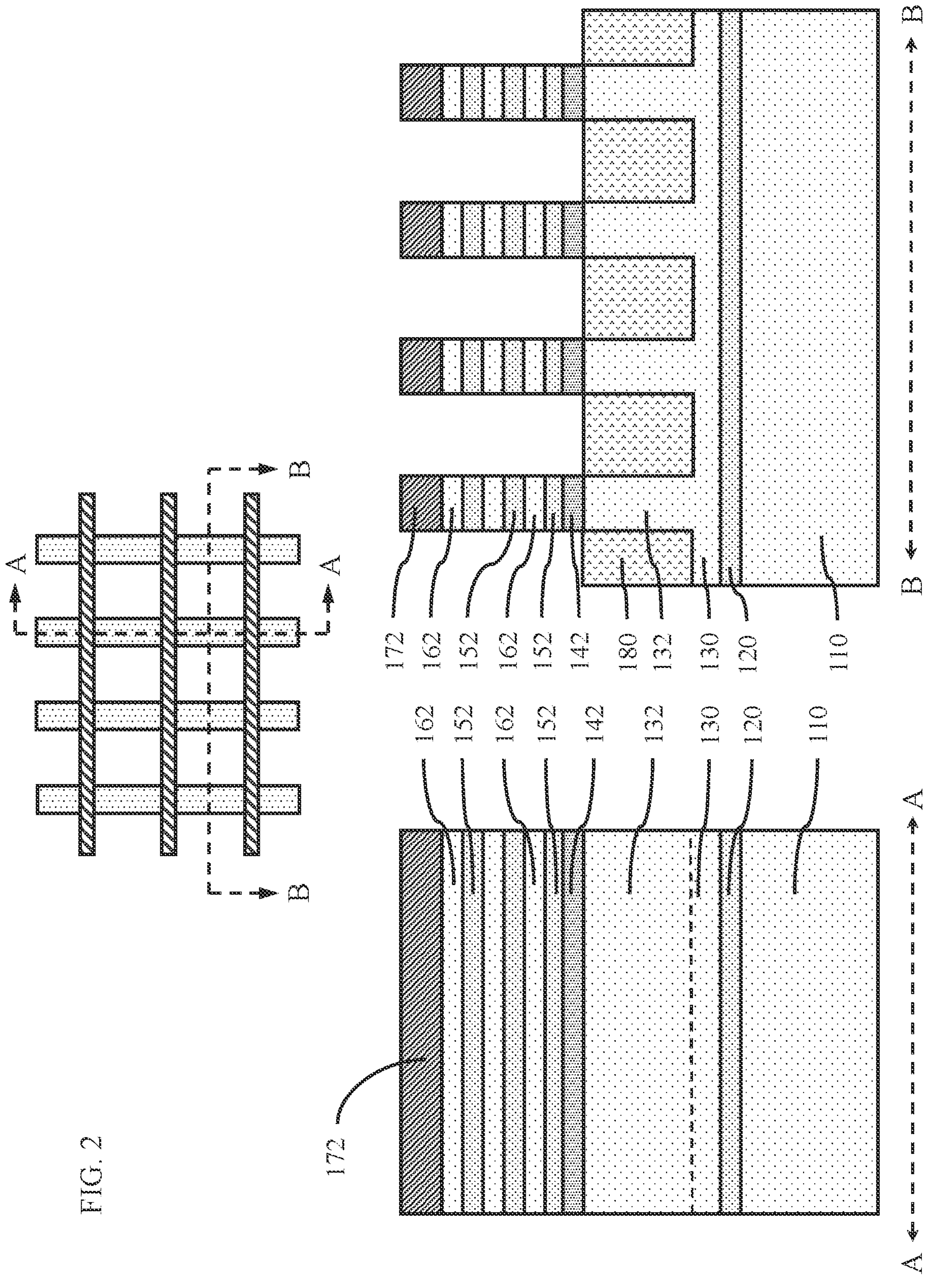
FIG. 2 shows perpendicular cross-sectional side views having patterned nanosheet stacks on a substrate with intervening shallow trench isolation regions, in accordance with an embodiment of the present invention.

FIG. 2 includes perpendicular cross-sectional side views showing patterned nanosheet stacks on a substrate with intervening shallow trench isolation regions, in accordance with an embodiment of the present invention.

In one or more embodiments, the masking layer 170, sacrificial nanosheet layers 150, semiconductor nanosheet layers 160, and bottom sacrificial layer 140 can be patterned, for example, by lithography and etching (e.g., reactive ion etching (RIE)), to form nanosheet templates 172 on underlying sacrificial nanosheet sections 152 and semiconductor nanosheet layer sections 162. The bottom sacrificial layer 140 can be etched to form a bottom sacrificial section 142, and the active semiconductor layer 130 can be etched to form trenches with an active semiconductor mesa 132 beneath the bottom sacrificial section 142 and a patterned nanosheet stack of alternating sacrificial nanosheet sections 152 and semiconductor nanosheet layer sections 162.

In one or more embodiments, shallow trench isolation regions 180 can be formed adjacent to the active semiconductor mesa(s) 132, where a top surface of the shallow trench isolation regions 180 can be at or above the bottom surface of the bottom sacrificial section 142, where the top surface of the shallow trench isolation regions 180 can be at or below the middle of the bottom sacrificial section 142. The shallow trench isolation regions 180 can be formed by a directional deposition and selective etch-back. In various embodiments, a portion of the active semiconductor layer 130 can remain between the bottom surface of the shallow trench isolation regions 180 and the top surface of the buried etch-stop layer 120, where the etching of the active semiconductor layer 130 does not extend all the way down to the buried etch-stop layer 120.

In various embodiments, the shallow trench isolation regions 180 can be formed of an electrically insulating dielectric material, for example, silicon oxide ($SiO_x$), silicon oxynitride (SiON), and combinations thereof.

Figure 3:
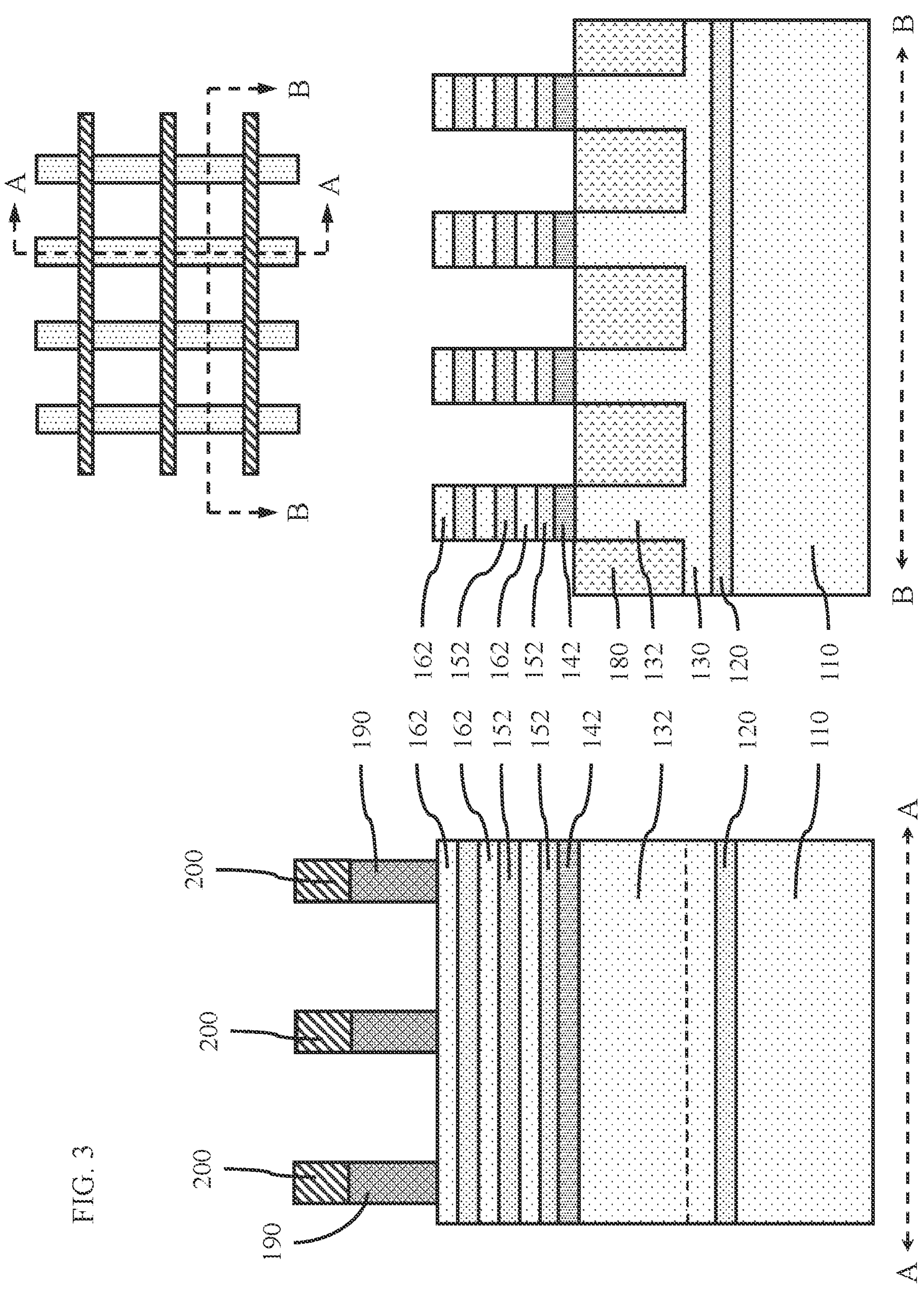
FIG. 3 shows perpendicular cross-sectional side views having dummy gate structures with gate templates formed across the nanosheet stacks, in accordance with an embodiment of the present invention.

FIG. 3 includes perpendicular cross-sectional side views showing dummy gate structures with gate templates formed across the nanosheet stacks, in accordance with an embodiment of the present invention.

In one or more embodiments, the nanosheet templates 172 can be selectively removed to expose the underlying nanosheet stack.

In one or more embodiments, dummy gate structures 190 and a dummy gate cap 200 can be formed on the stack(s) of alternating sacrificial nanosheet sections 152 and semiconductor nanosheet layer sections 162. One or more dummy gate structures 190 can be formed on the stack of alternating sacrificial nanosheet sections 152 and semiconductor nanosheet layer sections 162, for example, by forming and patterning a dummy gate layer through lithography and etching.

In various embodiments, the dummy gate structures 190 can be, for example, amorphous silicon (a-Si), amorphous carbon (a-C), and combinations thereof. In various embodiments, the dummy gate cap 200 can be, for example, silicon nitride (SiN), silicon boro carbonitride (SiBCN), silicon oxy carbide (SiCO), silicon oxy carbonitride (SiOCN), and combinations thereof.

Figure 4:
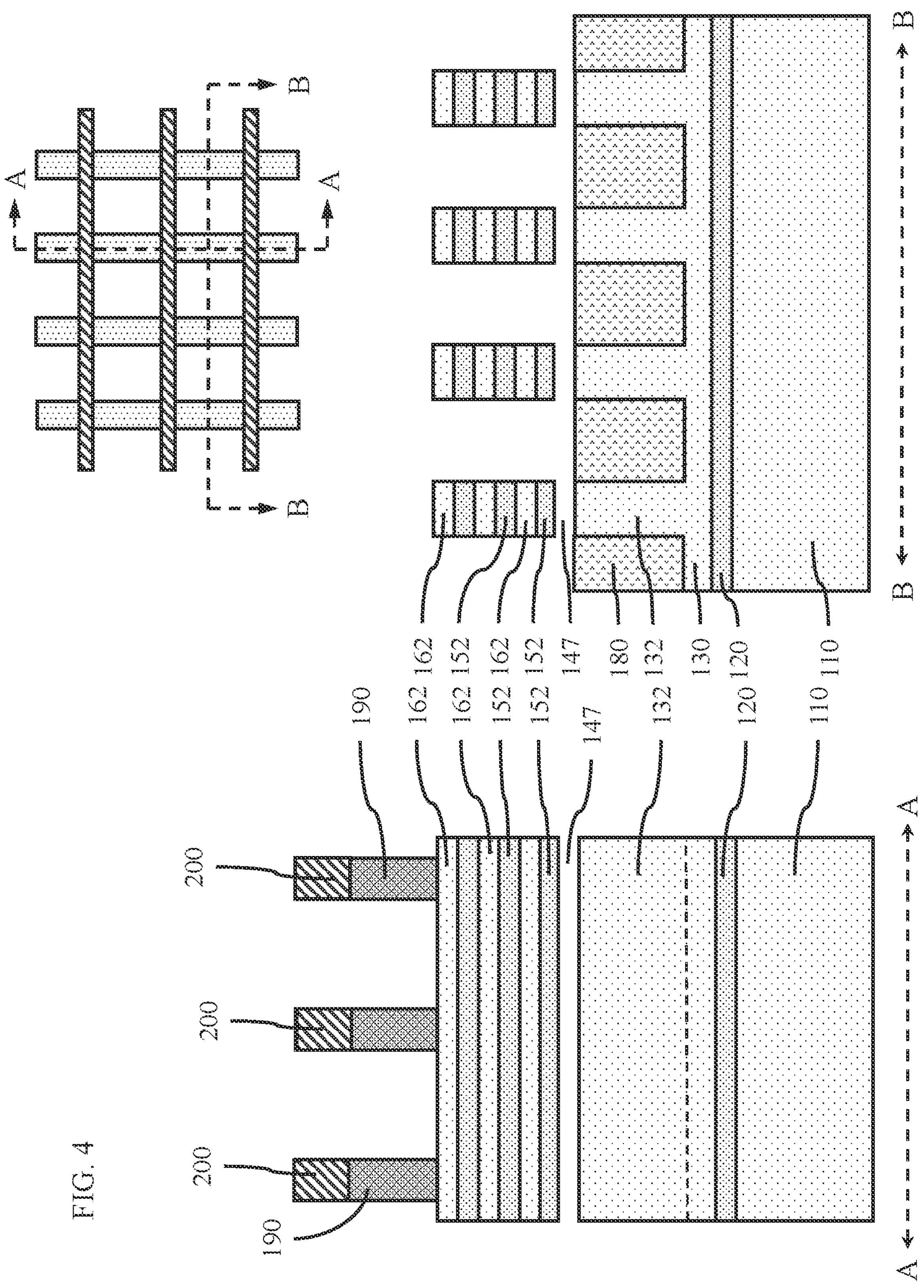
FIG. 4 shows perpendicular cross-sectional side views having the sacrificial layer removed beneath the nanosheet stacks, in accordance with an embodiment of the present invention.

FIG. 4 provides perpendicular cross-sectional side views showing removal of the sacrificial layer beneath the nanosheet stacks, in accordance with an embodiment of the present invention.

In one or more embodiments, the bottom sacrificial section(s) 142 can be selectively removed, for example, using a selective isotropic etch (e.g., wet chemical etch) that can form a channel 147 beneath the nanosheet stack of alternating sacrificial nanosheet sections 152 and semiconductor nanosheet layer sections 162.

Figure 5:
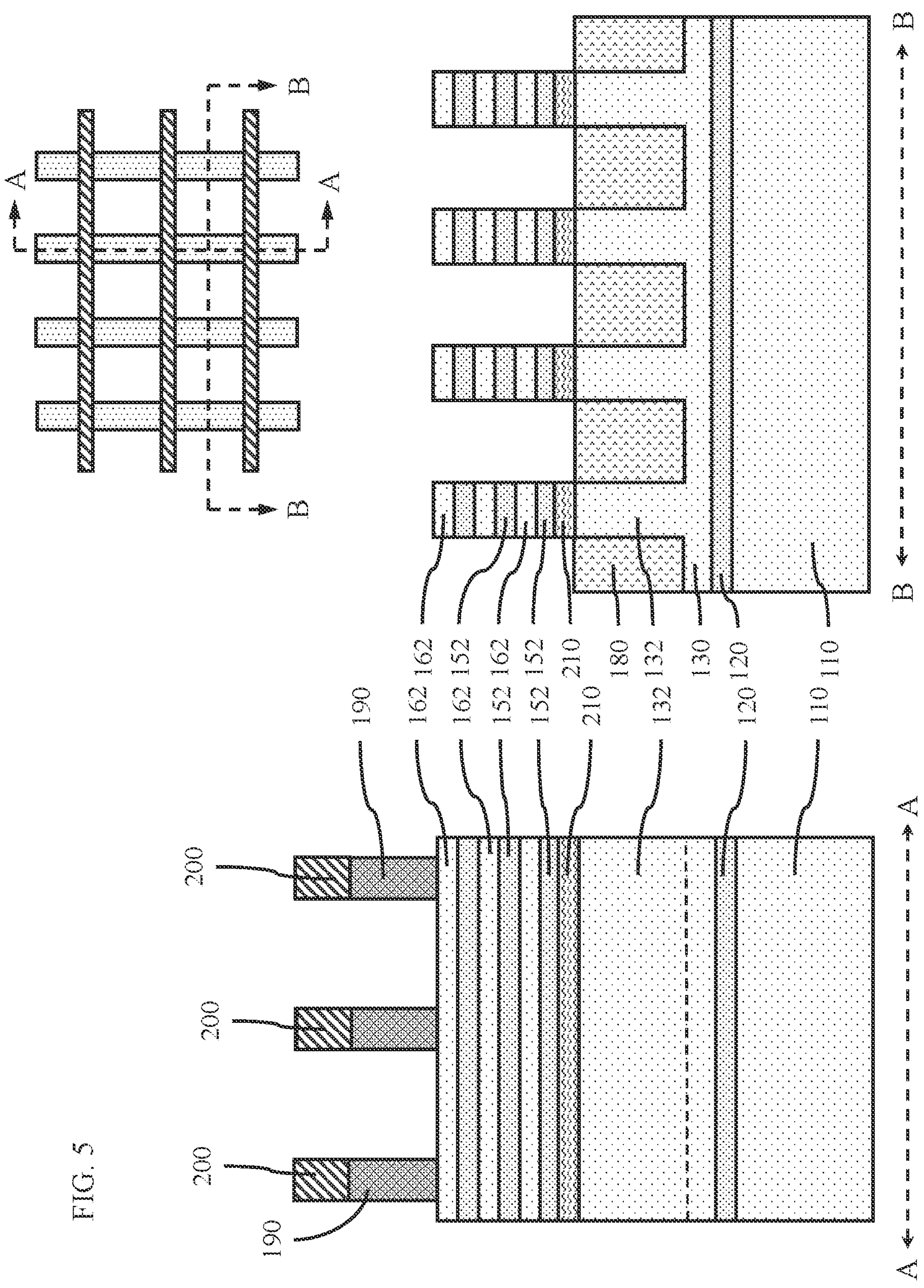
FIG. 5 shows perpendicular cross-sectional side views having a buried insulating layer replacing the bottom sacrificial layer beneath the nanosheet stacks, in accordance with an embodiment of the present invention.

FIG. 5 includes perpendicular cross-sectional side views showing a buried insulating layer replacing the bottom sacrificial layer beneath the nanosheet stacks, in accordance with an embodiment of the present invention.

In one or more embodiments, a buried insulating layer 210 can be formed in the channels 147, where the buried insulating layer can be formed by a conformal deposition (e.g., atomic layer deposition (ALD)), and an etch-back performed to leave the insulating layer in the channels 147.

In various embodiments, the buried insulating layer 210 can be, for example, silicon nitride (SiN), silicon boro carbonitride (SiBCN), silicon oxy carbide (SiCO), silicon oxy carbonitride (SiOCN), and combinations thereof.

Figure 6:
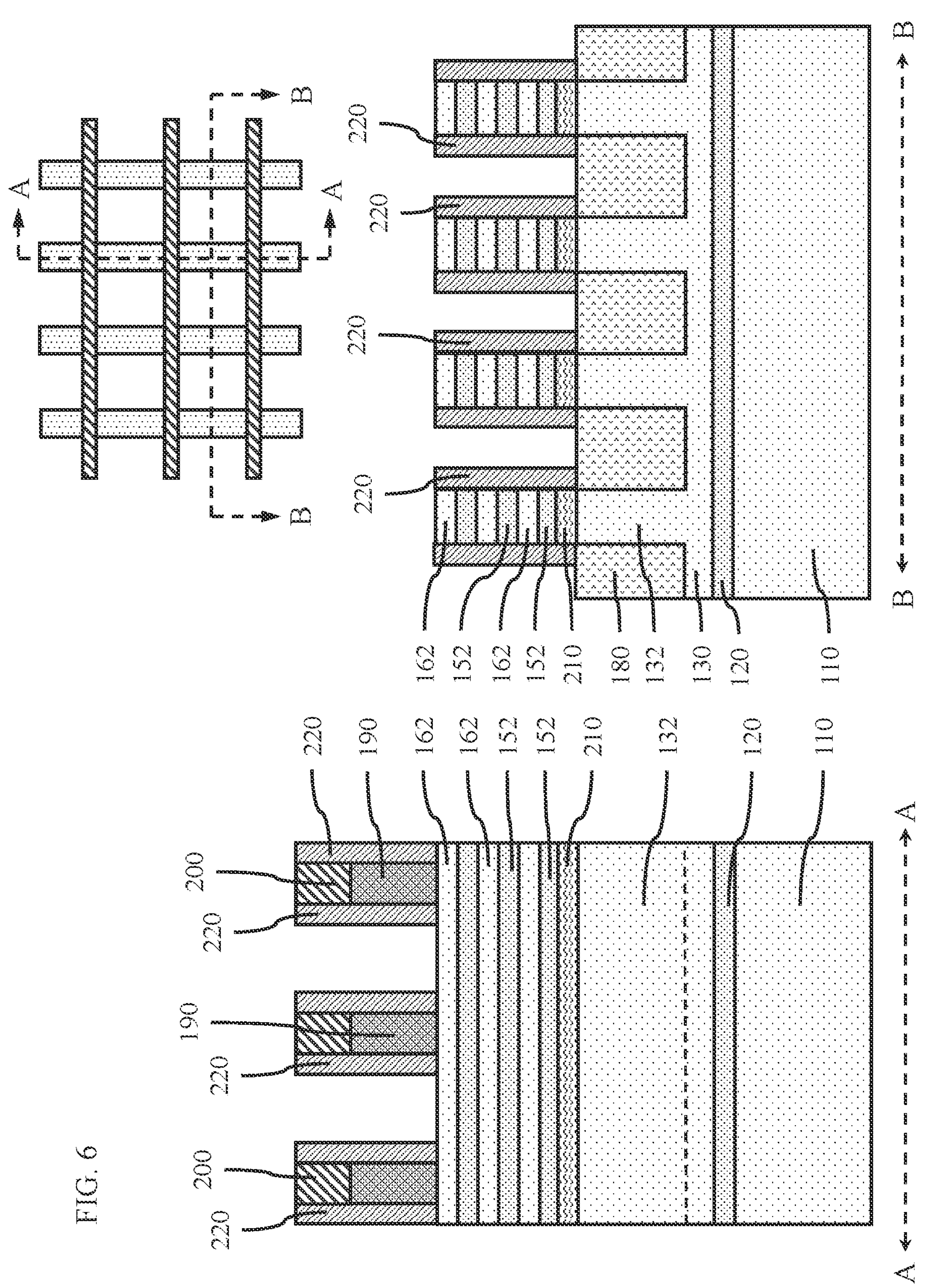
FIG. 6 shows perpendicular cross-sectional side views having insulating sidewalls formed on the nanosheet stacks and the dummy gate structures, in accordance with an embodiment of the present invention.

FIG. 6 provides perpendicular cross-sectional side views showing insulating sidewalls formed on the nanosheet stacks and the dummy gate structures, in accordance with an embodiment of the present invention.

In one or more embodiments, insulating sidewalls 220 can be formed on the nanosheet stacks, the dummy gate structures 190, and the dummy gate caps 200, where the insulating sidewalls 220 can be formed by a conformal deposition and directional etch-back (e.g., reactive ion etch (RIE)) to expose the uppermost semiconductor nanosheet layer sections 162 and shallow trench isolation regions 180.

In various embodiments, the insulating sidewalls 220 can be, for example, silicon nitride (SiN), silicon boro carbonitride (SiBCN), silicon oxy carbide (SiCO), silicon oxy carbonitride (SiOCN), and combinations thereof.

Figure 7:
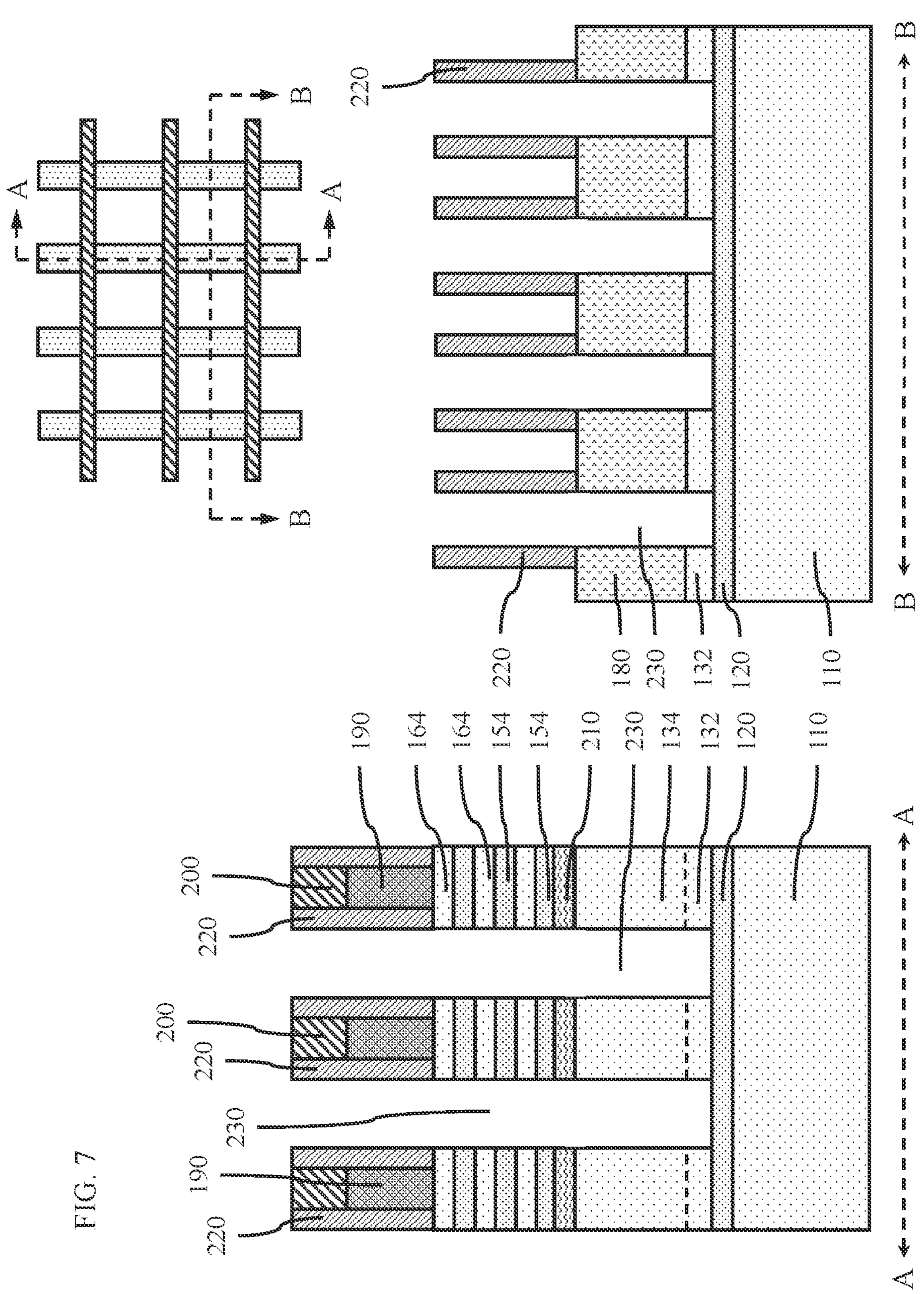
FIG. 7 shows perpendicular cross-sectional side views having the nanosheet stacks partitioned into nanosheet segments, in accordance with an embodiment of the present invention.

FIG. 7 includes perpendicular cross-sectional side views showing the nanosheet stacks partitioned into nanosheet segments, in accordance with an embodiment of the present invention.

In various embodiments, portions of the sacrificial nanosheet sections 152 and semiconductor nanosheet layer sections 162 can be exposed between the insulating sidewalls 220 of the dummy gate structure 190. The exposed portions of the sacrificial sections 152 and nanosheet layer sections 162 can be removed using a selective directional etch (e.g., RIE) to form a stack of alternating sacrificial nanosheet segments 154 and semiconductor nanosheet layer segments 164. Removal of the exposed portions of the sacrificial nanosheet sections 152 and semiconductor nanosheet layer sections 162 can expose a portion of the buried insulating layer 210, which can be removed using a selective isotropic etch (e.g., RIE) to expose the underlying portion of the active semiconductor mesa 132 between the dummy gate structures.

In various embodiments, a portion of the active semiconductor mesa 132 can be removed to form semiconductor mesa segments 134 separated by mesa cavities 230. A portion of the active semiconductor mesa 132 can be removed from between shallow trench isolation regions 180, and between the semiconductor mesa segments 134. A portion of the active semiconductor mesa 132 can remain beneath the shallow trench isolation regions 180. Removal of the portions of the active semiconductor mesa 132 can stop at and expose the underlying buried etch-stop layer 120.

In various embodiments, portions of the insulating sidewalls 220 can be on the shallow trench isolation regions 180.

Figure 8:
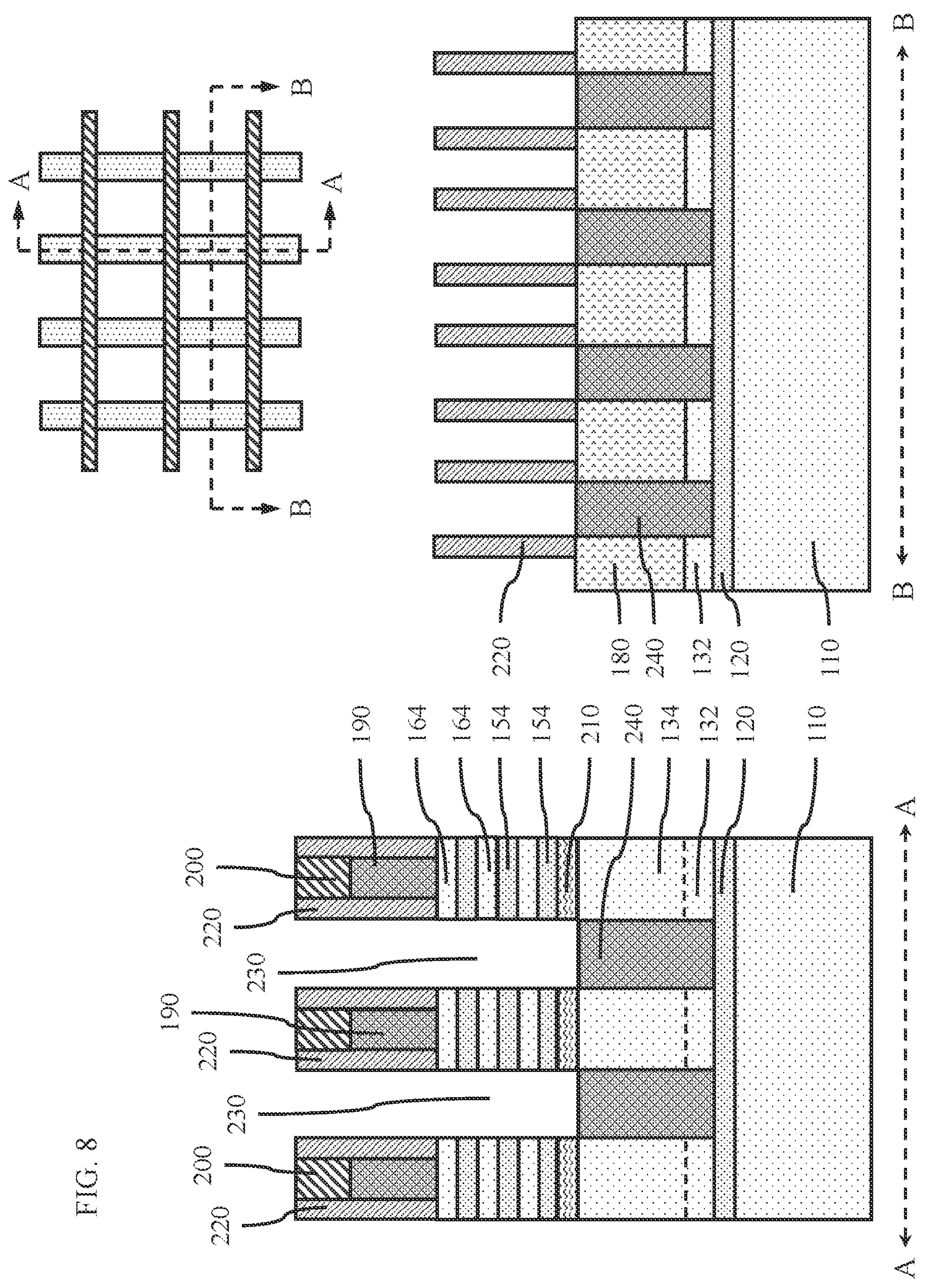
FIG. 8 shows perpendicular cross-sectional side views having the formation of sacrificial plugs between the nanosheet segments, isolation regions, and substrate mesas, in accordance with an embodiment of the present invention.

FIG. 8 includes perpendicular cross-sectional side views showing the formation of sacrificial plugs between the nanosheet segments, isolation regions, and substrate mesas, in accordance with an embodiment of the present invention.

In one or more embodiments, a sacrificial plug 240 can be formed in each of the mesa cavities 230 between the semiconductor mesa segments 134 and between the shallow trench isolation regions 180, where the sacrificial plugs 240 can be formed by a directional deposition and etch-back. The top surface of the sacrificial plugs 240 can be at or above the top surface of the shallow trench isolation regions 180 and the buried insulating layer 210.

In various embodiments, the top surface(s) of the sacrificial plugs 240 can extend above the top surfaces of the shallow trench isolation regions 180, and cover a lower portion of the inside sidewalls of the insulating sidewalls 220.

In various embodiments, the sacrificial plugs 240 can be made of an insulating dielectric material, including, but not limited to, aluminum oxide (AlO), titanium oxide (TiO), a semiconductor material, including, but not limited to, silicon carbide (SiC), silicon germanium (SiGe), and combinations thereof, where the sacrificial plugs 240 can be selectively removed relative to the semiconductor mesa segments 134, shallow trench isolation regions 180, the insulating sidewalls 220, and the buried insulating layer 210.

Figure 9:
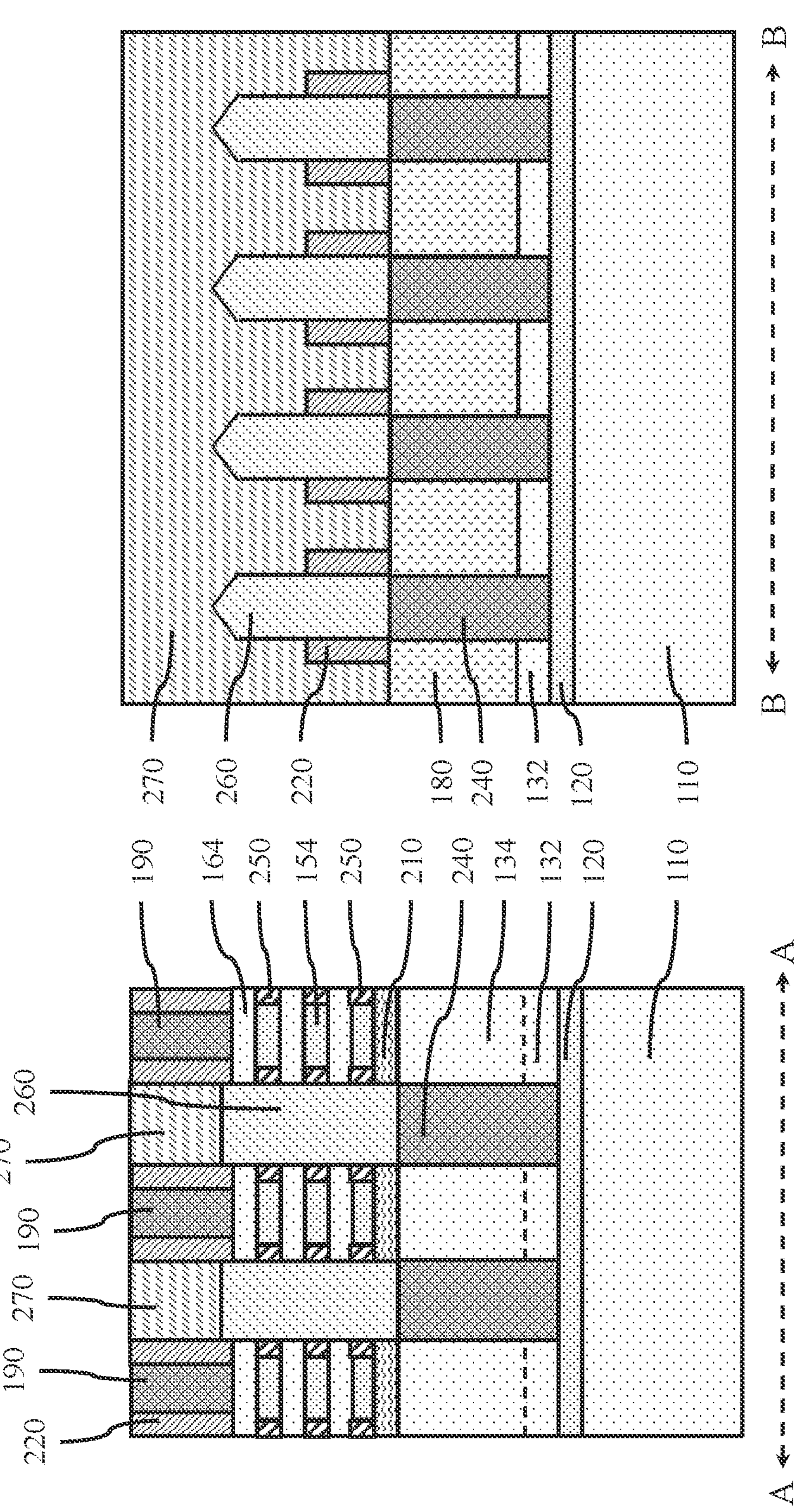
FIG. 9 shows perpendicular cross-sectional side views having source/drains formed on the sacrificial plugs, and a dielectric cover layer formed on the source/drains, in accordance with an embodiment of the present invention.

FIG. 9 includes perpendicular cross-sectional side views showing source/drains formed on the sacrificial plugs, and a dielectric cover layer formed on the source/drains, in accordance with an embodiment of the present invention.

In various embodiments, a portion of each of the alternating sacrificial nanosheet segments 154 can be removed to form recesses, where a dielectric insulating material can be formed in the recesses to form inner spacers 250. The inner spacers 250 can be formed by a conformal deposition (e.g., ALD), and an isotropic etch-back that leaves dielectric insulating material in the channels.

In various embodiments, the inner spacers 250 can be a dielectric insulating material, including, but not limited to, silicon nitride (SiN), silicon boro carbonitride (SiBCN), silicon oxy carbide (SiCO), silicon oxy carbonitride (SiOCN), and combinations thereof. In various embodiments, inner spacers 250 can be the same material as the insulating sidewalls 220.

In one or more embodiments, source/drains 260 can be formed on the sacrificial plug 240 and between adjacent sacrificial nanosheet segments 154 and semiconductor nanosheet layer segments 164, where the source/drains 260 can be formed by lateral epitaxial growth from the exposed sides of the semiconductor nanosheet layer segments 164. The inner spacers 250 can electrically separate the sacrificial nanosheet segments 154 from the source/drains 260.

In various embodiments, a portion of the insulating sidewalls 220 can cover the sidewalls of the source/drains 260.

In one or more embodiments, the dummy gate cap 200 and a portion of the insulating sidewalls 220 can be removed to expose the dummy gate structures 190. Removal of the portion of the insulating sidewalls 220 can expose an upper portion of the source/drains 260. The dummy gate cap 200 and insulating sidewalls 220 can be removed, for example, using a chemical mechanical polish (CMP) and/or selective etching.

In one or more embodiments, an interlayer dielectric (ILD) layer 270 can be formed on the source/drains 260, remaining portions of the insulating sidewalls 220, and dummy gate structures 190 on different regions of the substrate, where the ILD layer 270 can be formed by a blanket deposition (e.g., chemical vapor deposition (CVD)). The interlayer dielectric (ILD) layer 270 can fill in the spaces between the insulating sidewalls 220 and above the source/drains 260. In various embodiments, the interlayer dielectric (ILD) layer 270 can be an electrically insulating dielectric layer, for example, silicon oxide ($SiO_x$). In various embodiments, the ILD layer 270 can be planarized using a chemical-mechanical polishing (CMP) to provide a smooth, uniform surface that exposes the top surfaces of the dummy gate structures 190 and insulating sidewalls 220.

Figure 10:
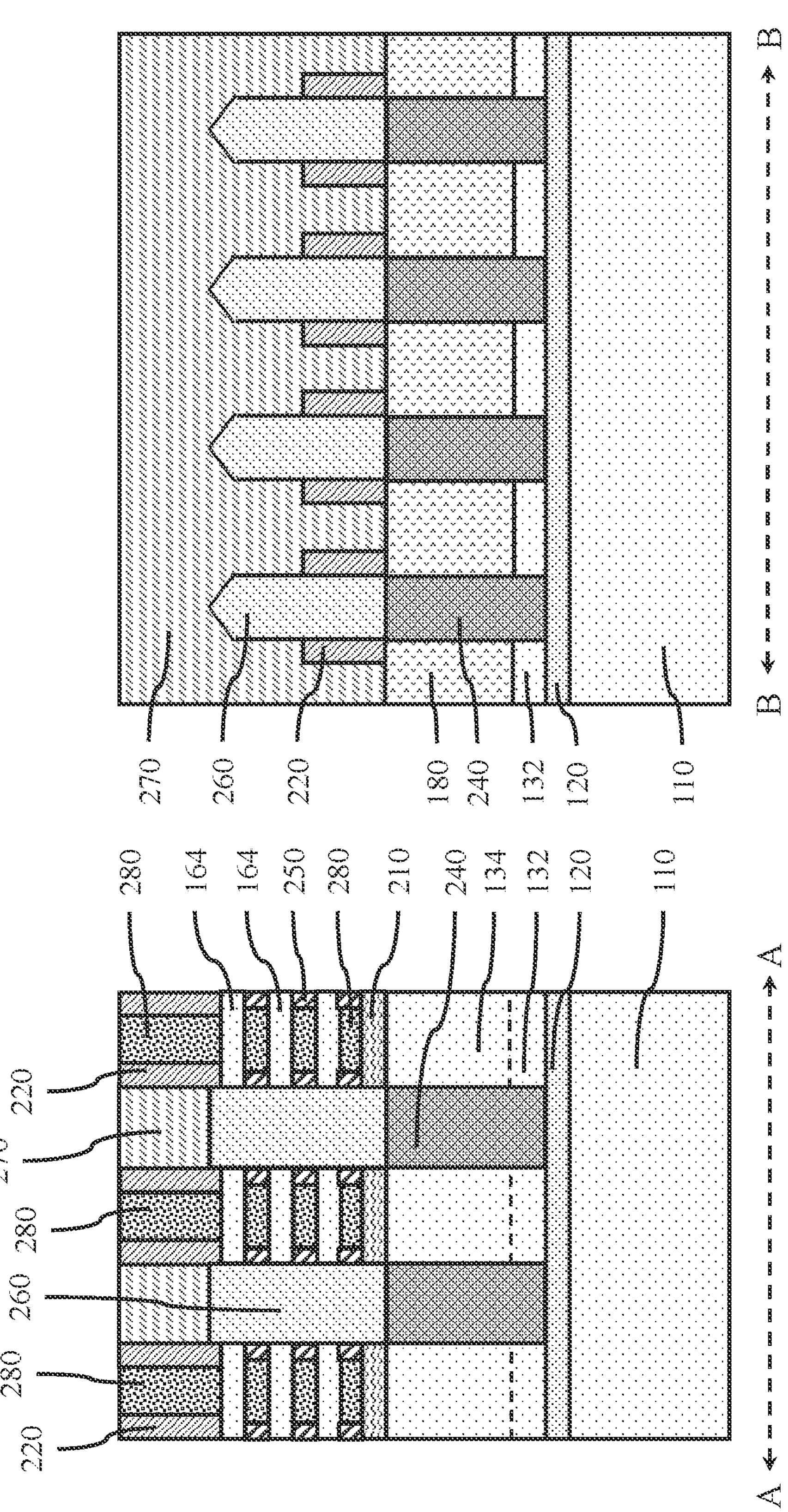
FIG. 10 shows perpendicular cross-sectional side views having replacement of the dummy gate structures and sacrificial nanosheet segments with active gate structures, in accordance with an embodiment of the present invention.

FIG. 10 includes perpendicular cross-sectional side views showing replacement of the dummy gate structures and sacrificial nanosheet segments with active gate structures, in accordance with an embodiment of the present invention.

In one or more embodiments, the dummy gate structures 190 exposed by removal of the portion(s) of the ILD layer 270 can be removed using a selective etch to expose a top-most segment of the sacrificial nanosheet segments 154 and semiconductor nanosheet layer segments 164.

In one or more embodiments, the exposed sacrificial nanosheet segments 154 can be removed using selective, isotropic etches (e.g., RIE) to expose the surfaces of the semiconductor nanosheet layer segments 164 and an underlying portion of the buried insulating layer 210. Portions of the nanosheet layer segments 164 may remain adjoining the source/drains and separated by the inner spacers 250.

In one or more embodiments, replacement metal gate structures 280 can be formed in the spaces created by removal of the dummy gate structures 190 and sacrificial nanosheet segments 154, where the replacement metal gate structures 280 can be formed by conformal deposition (e.g., ALD). In various embodiments, the replacement metal gate structures 280 can include a gate dielectric layer and a conductive gate fill. The gate dielectric layer can be formed on the semiconductor nanosheet layer segments 164 using a conformal deposition. A conductive gate fill can be formed on the gate dielectric layer, where the conductive gate fill can include a work function layer formed on the gate dielectric layer and a conductive gate electrode formed on the work function layer.

In various embodiments, the gate dielectric layer can be a high-k dielectric material, and the conductive gate fill can be, for example, a metal having an intended conductance and/or work function, for example, tantalum (Ta), titanium (Ti), tungsten (W), etc.

The inner spacers 250 can electrically separate the replacement metal gate structures 280 from the source/drains 260, and the buried insulating layer 210 can separate the replacement metal gate structures 280 from the semiconductor mesa segments 134.

Figure 11:
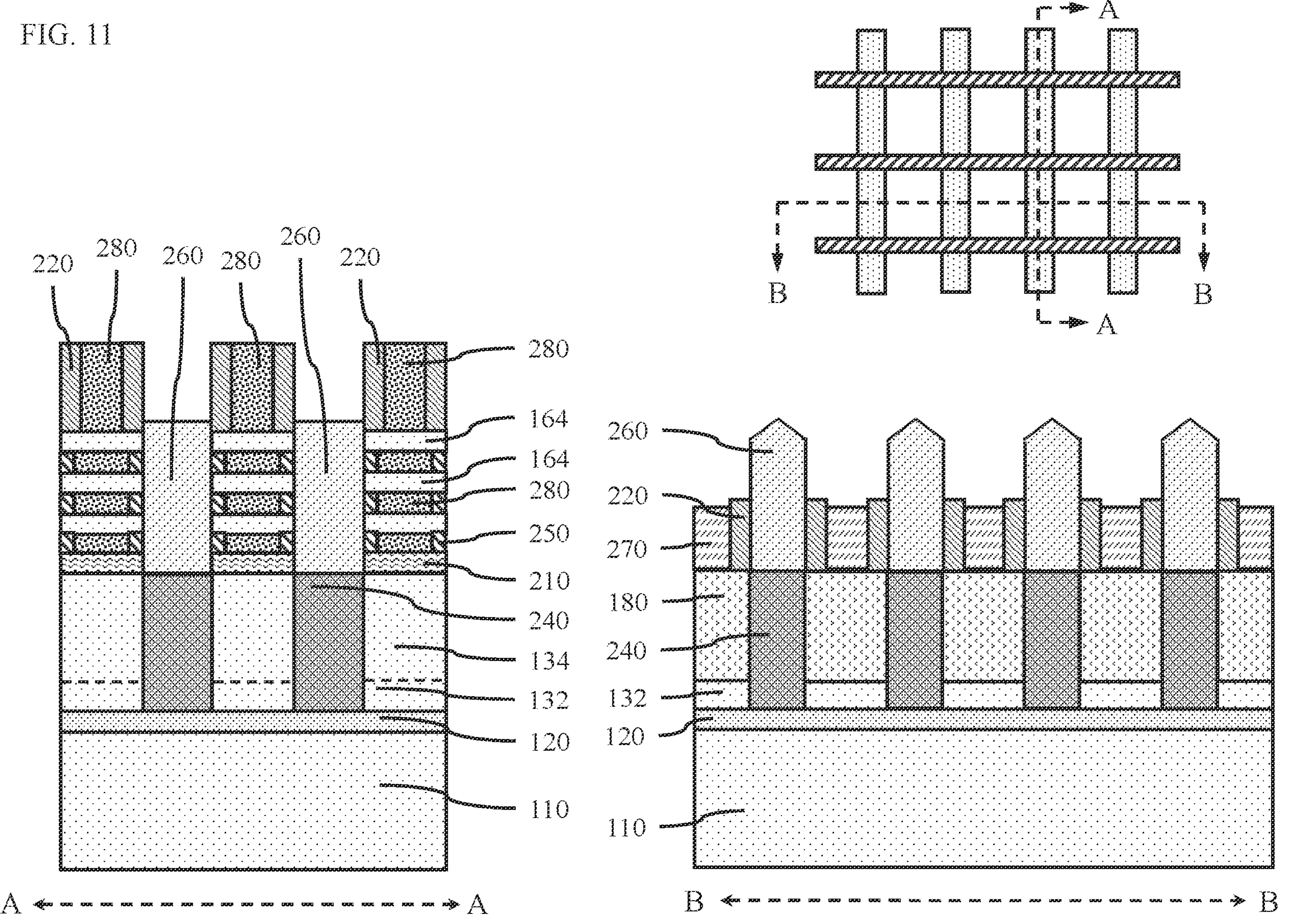
FIG. 11 shows perpendicular cross-sectional side views having the dielectric cover layer partially removed from the source/drains, in accordance with an embodiment of the present invention.

FIG. 11 includes perpendicular cross-sectional side views showing the dielectric cover layer partially removed from the source/drains, in accordance with an embodiment of the present invention.

In one or more embodiments, an upper portion of the interlayer dielectric (ILD) layer 270 can be removed to expose the surfaces of the source/drains 260 above the insulating sidewalls 220 on the shallow trench isolation regions 180. The portion of the interlayer dielectric (ILD) layer 270 can be removed using a selective, isotropic etch. Removing the ILD layer 270 can expose a portion of the insulating sidewalls 220.

Figure 12:
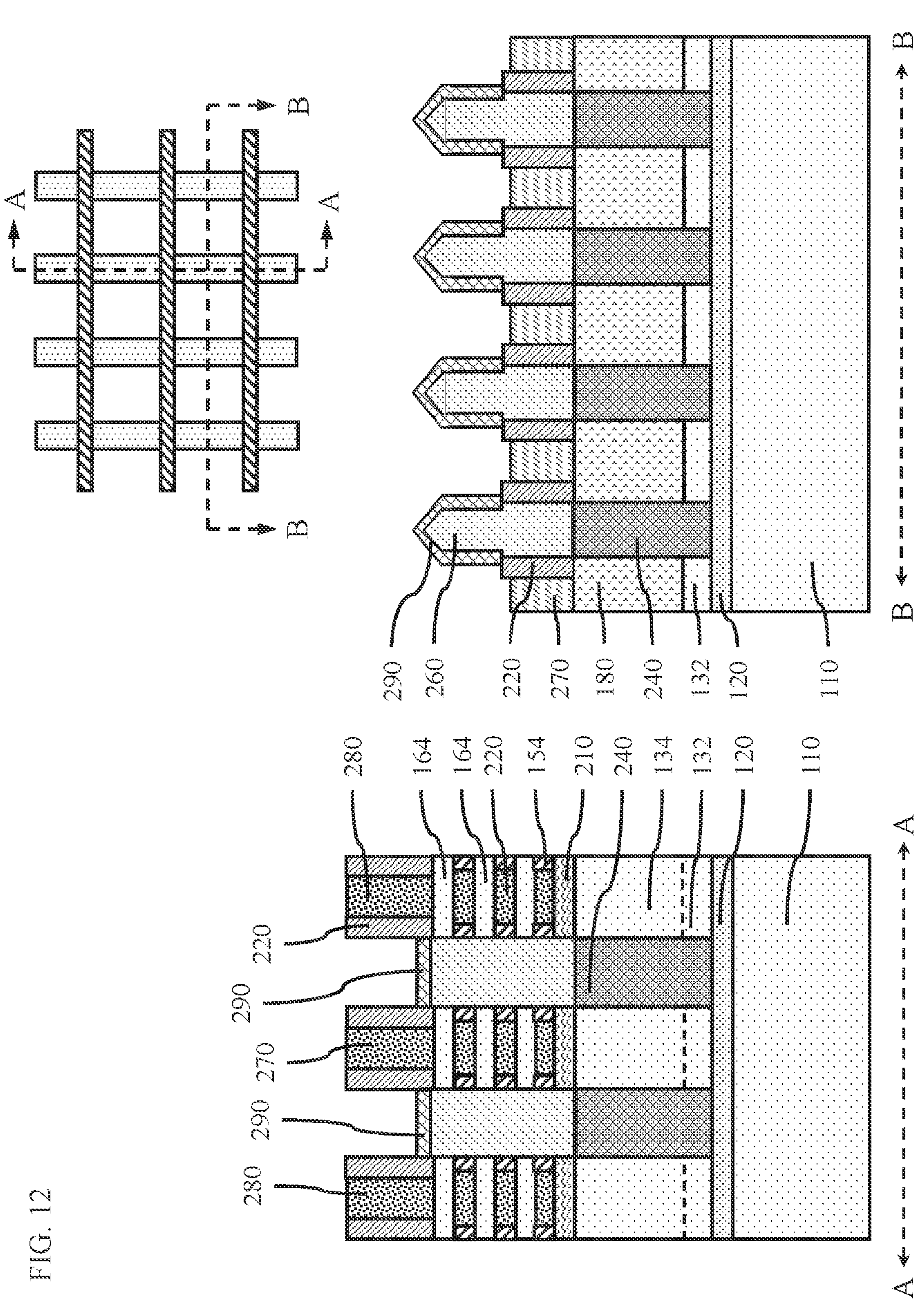
FIG. 12 shows perpendicular cross-sectional side views having a metal-silicide layer formed on the portion of the source/drains above the insulating sidewalls, in accordance with an embodiment of the present invention.

FIG. 12 includes perpendicular cross-sectional side views showing a metal-silicide layer formed on the portion of the source/drains above the insulating sidewalls, in accordance with an embodiment of the present invention.

In one or more embodiments, a metal can be formed on the exposed surfaces of the source/drains 260, and a heat treatment conducted to form a metal-silicide layer 290. The metal layer can be formed on the source/drains 260 by a selective, conformal deposition, so the metal only deposits on the semiconductor surface of the source/drains 260. The heat treatment can be at a sufficient temperature for a sufficient time for the metal to react with the silicon of the source/drains 260 to form the metal-silicide layer 290.

Formation of the metal-silicide layer 290 can use an outer portion of the source/drains 260, thereby reducing the source/drain width, while the metal-silicide layer 290 extends over the insulating sidewalls 220 to create a greater overall width. The tops of the source/drains 260 can be covered by the metal-silicide layer 290.

In various embodiments, the materials for forming the metal-silicide layer 290 can include, for example, TiSi, NiSi, NiPtSi, CoSi and combinations of these and other metals or may include other metal silicides.

Figure 13:
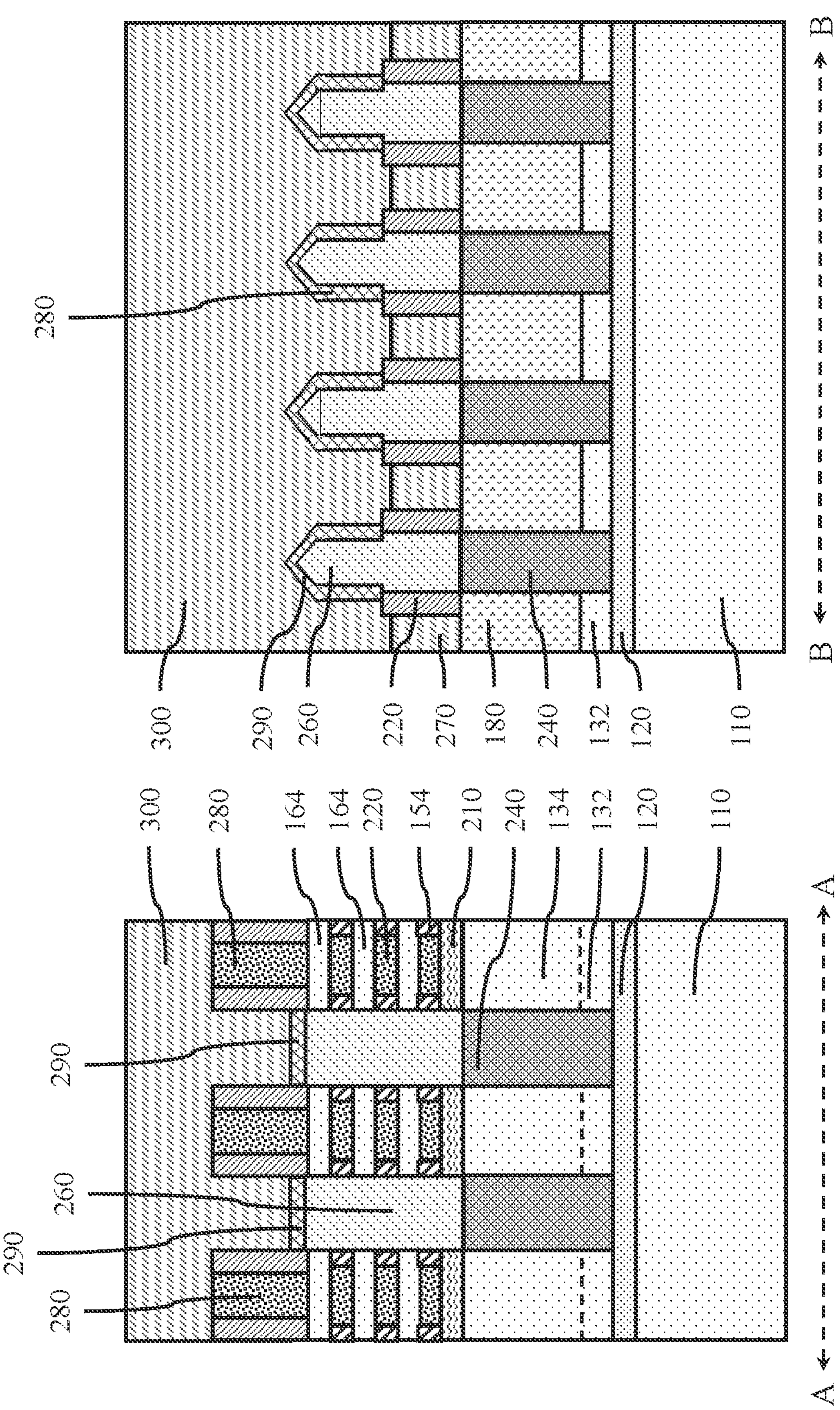
FIG. 13 shows perpendicular cross-sectional side views having a second interlayer dielectric (ILD) layer formed on the source/drains and active gate structures, in accordance with an embodiment of the present invention.

FIG. 13 includes perpendicular cross-sectional side views showing formation of a second interlayer dielectric (ILD) layer on the source/drains and active gate structures, in accordance with an embodiment of the present invention.

In one or more embodiments, a second interlayer dielectric (ILD) layer 300 can be formed on the metal-silicide layer 290, source/drains 260, remaining portions of the insulating sidewalls 220, and replacement metal gate structures 280, where the ILD layer 300 can be formed by a blanket deposition (e.g., chemical vapor deposition (CVD)). The second interlayer dielectric (ILD) layer 300 can fill in the spaces between the insulating sidewalls 220 and above the source/drains 260 and metal-silicide layer 290.

In various embodiments, the second interlayer dielectric (ILD) layer 300 can be an electrically insulating dielectric layer, for example, silicon oxide ($SiO_x$), where the second interlayer dielectric (LLD) layer 300 can be the same materials as the first ILD layer 270. In various embodiments, the second interlayer dielectric (ILD) layer 300 can be planarized using a chemical-mechanical polishing (CMP) to provide a smooth, uniform surface.

Figure 14:
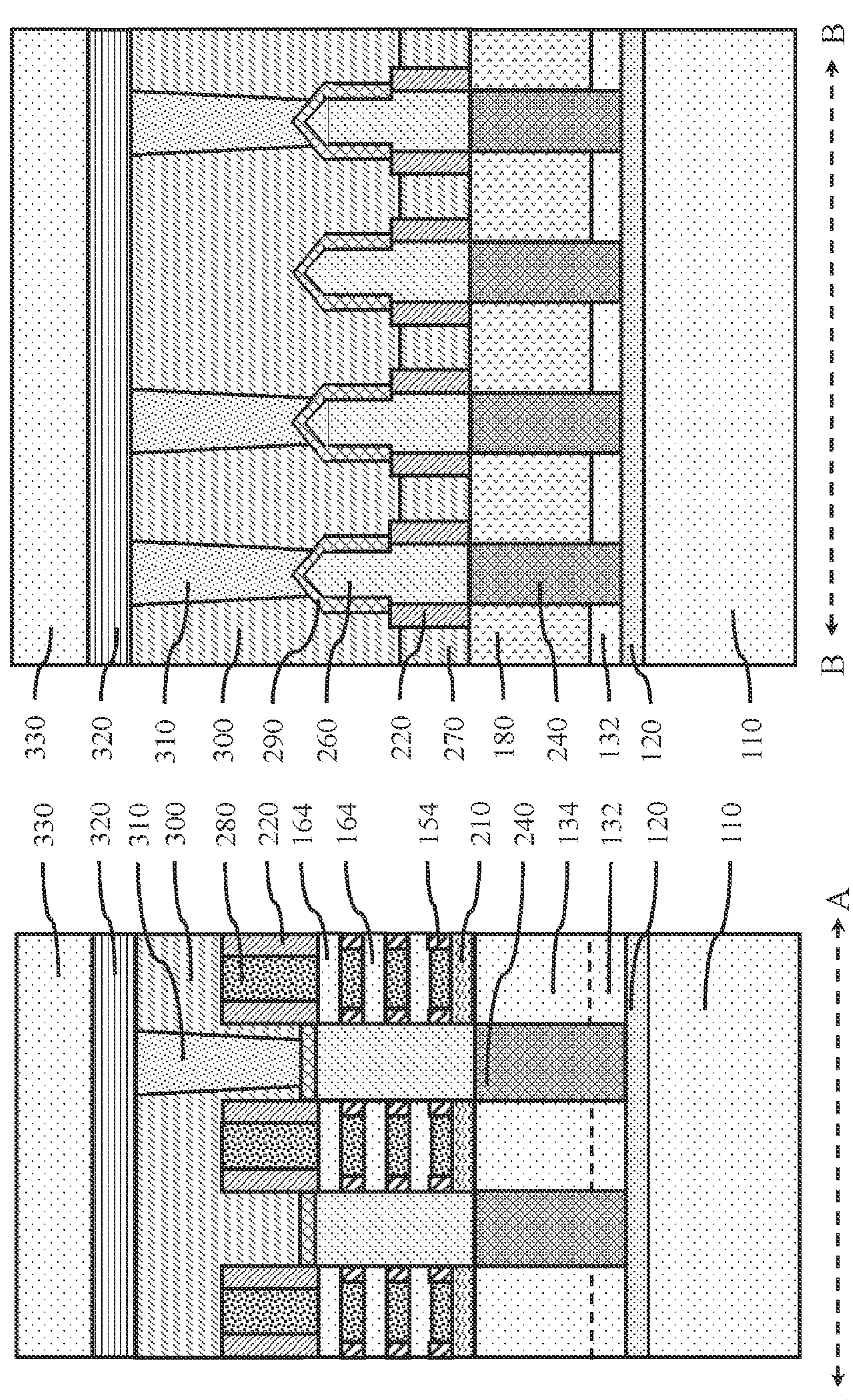
FIG. 14 shows perpendicular cross-sectional side views having source/drain contacts formed to the source/drains, and a back-end-of-line (BEOL) interconnect layer formed on the second ILD layer and source/drain contacts, and a carrier layer formed on the BEOL interconnect layer, in accordance with an embodiment of the present invention.

FIG. 14 includes perpendicular cross-sectional side views showing formation of source/drain contacts to the source/drains, and a back-end-of-line (BEOL) interconnect layer on the second ILD layer and source/drain contacts, and a carrier layer on the BEOL interconnect layer, in accordance with an embodiment of the present invention.

In one or more embodiments, one or more source/drain contacts 310 can be formed in the second ILD layer 300, where the source/drain contacts 310 form electrical connections to the metal-silicide layer 290 and source/drains 260. In various embodiments, the source/drain contacts 310 can be a metal, for example, copper (Cu), tungsten (W), tantalum (Ta), molybdenum (Mo), cobalt (Co), ruthenium (Ru) and combinations thereof. The source/drain contacts 310 can be the same metal used to form the metal-silicide layer 290. In useful embodiments, an adhesion metal liner, such as TiN, can be applied before forming the source/drain contacts 310.

In one or more embodiments, a back-end-of-line (BEOL) interconnect layer 320 can be formed on the second ILD layer 300, where the BEOL Interconnect layer 320 can include additional metal lines and vias for electrical connections to the source/drain contacts 310 of the semiconductor devices.

In one or more embodiments, a carrier layer 330, for example, a semiconductor wafer, can be attached to the top surface of the BEOL Interconnect layer 320, where the carrier layer 330 can be attached through bonding. In various embodiments, the carrier wafer 320 can be a semiconductor wafer having a thickness sufficient to transfer and transport the attached substrate 110 and intervening layers and features.

Figure 15:
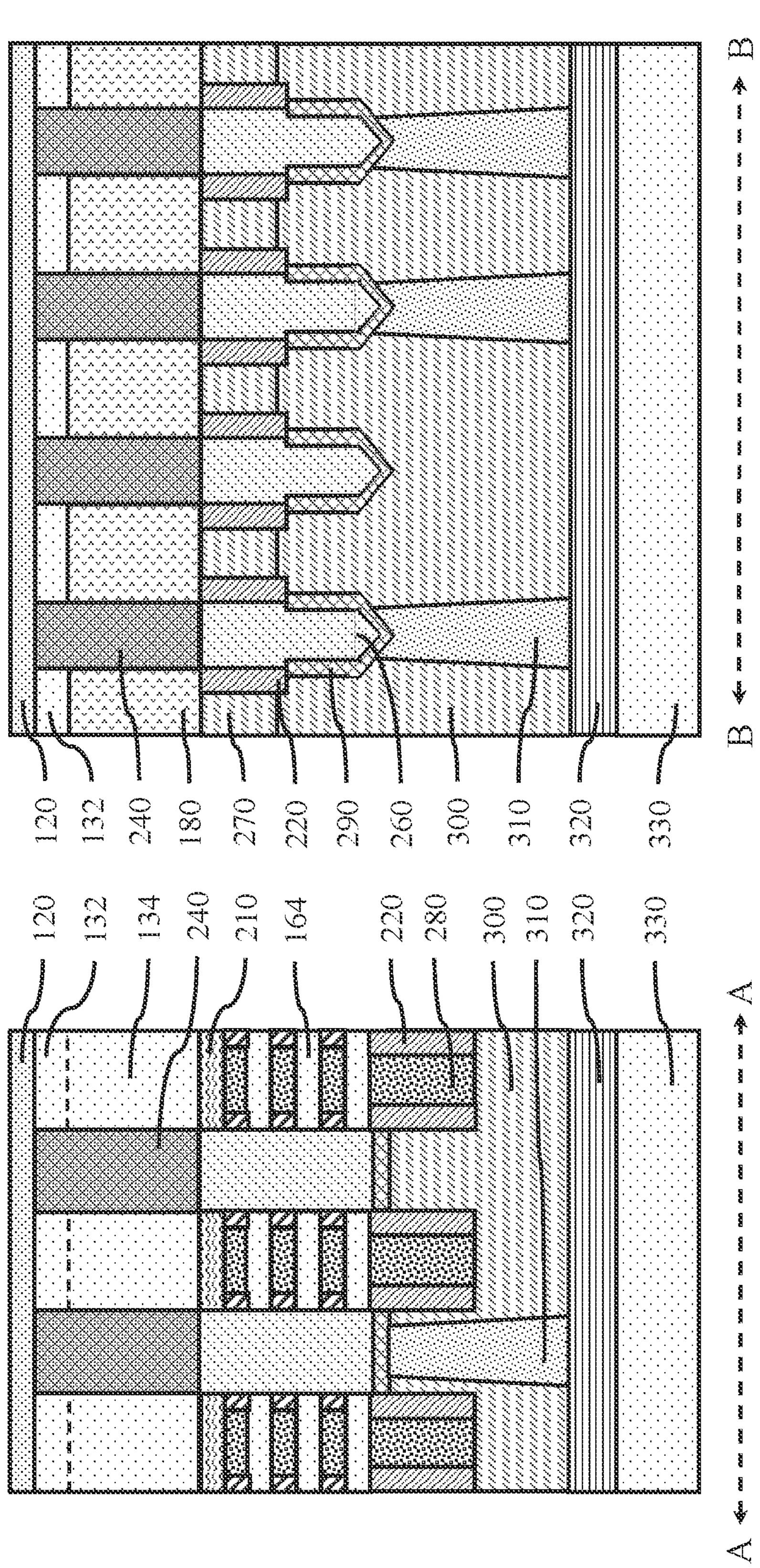
FIG. 15 shows perpendicular cross-sectional side views having the substrate and carrier wafer flipped, and the substrate removed, in accordance with an embodiment of the present invention.

FIG. 15 includes perpendicular cross-sectional side views showing flipping of the substrate and carrier wafer, and removal of the substrate, in accordance with an embodiment of the present invention.

In one or more embodiments, the substrate 110 with the bonded carrier layer 330 can be flipped 180 degrees (i.e., inverted), so the bottom surface of the substrate 110 becomes the top working surface, and the carrier layer 320 becomes the support for the substrate 110 and the intervening layers and devices.

In one or more embodiments, the substrate 110 can be removed, for example, using CMP and/or selective etching (e.g., wet chemical etch) to expose the buried etch-stop layer 120, where the buried etch-stop layer 120 is etch-selective to the substrate material.

Figure 16:
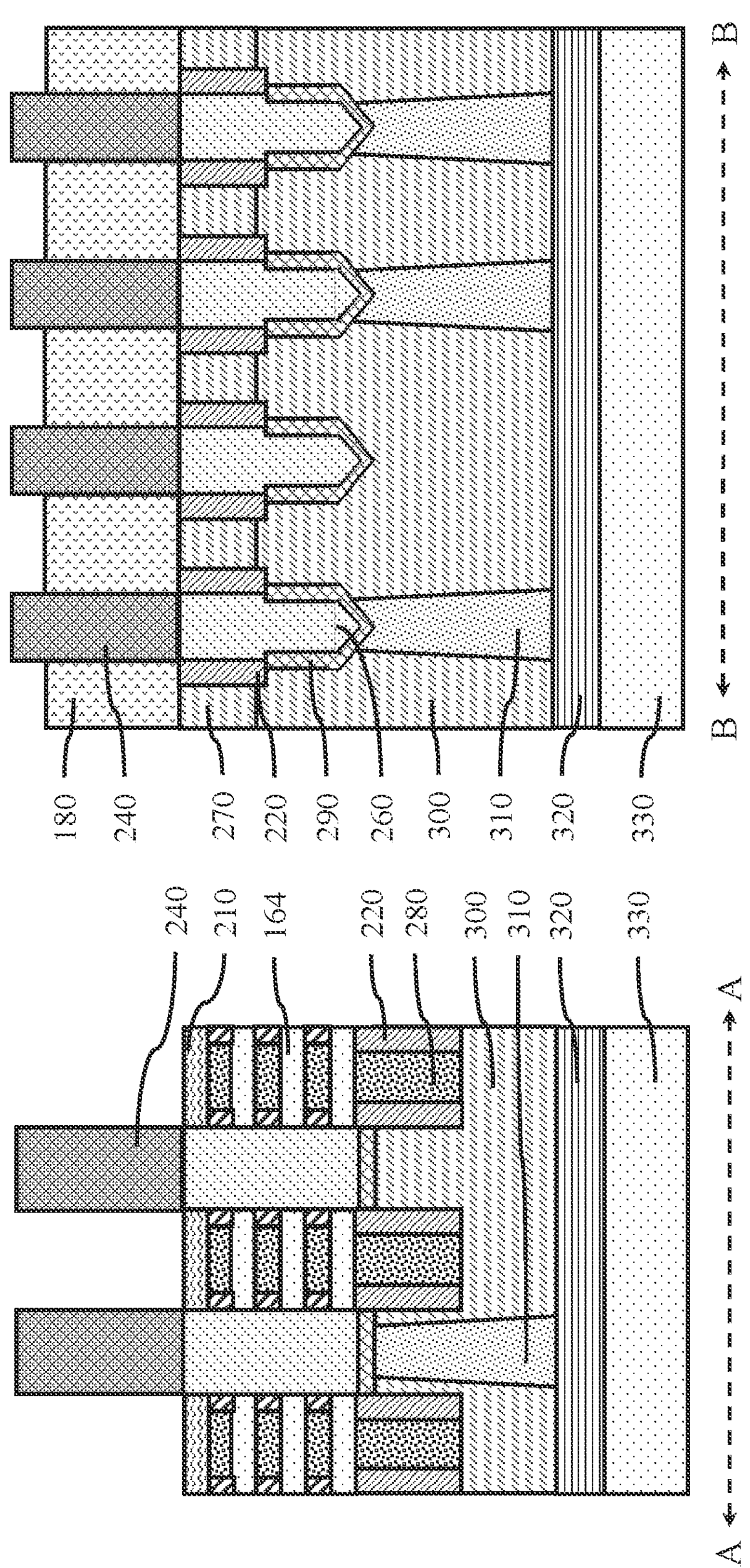
FIG. 16 shows perpendicular cross-sectional side views with the removal of the etch-stop layer and semiconductor mesa segments to expose the sacrificial plugs, in accordance with an embodiment of the present invention.

FIG. 16 includes perpendicular cross-sectional side views showing removal of the etch-stop layer, and semiconductor mesa segments to expose the sacrificial plugs, in accordance with an embodiment of the present invention.

In one or more embodiments, the buried etch-stop layer 120, remaining active semiconductor mesas 132 and semiconductor mesa segments 134 can be removed by selective etching, where the removal of the remaining active semiconductor mesas 132 and semiconductor mesa segments 134 can expose the sacrificial plug 240, buried insulating layer 210, and the shallow trench isolation regions 180.

Figure 17:
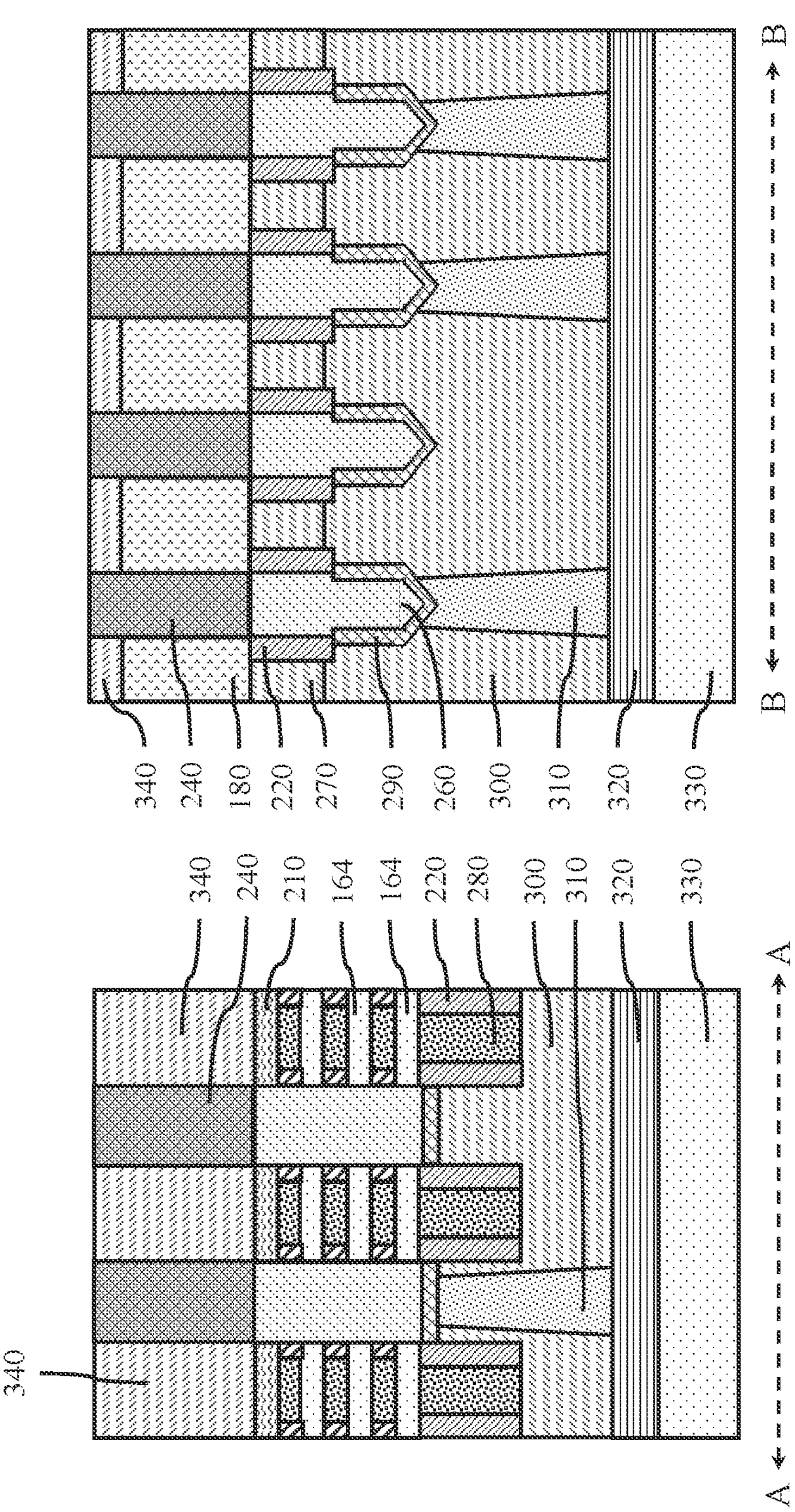
FIG. 17 shows perpendicular cross-sectional side views having a backside ILD layer formed on the isolation layer and sacrificial plugs, in accordance with an embodiment of the present invention.

FIG. 17 includes perpendicular cross-sectional side views showing formation of backside ILD layer on the isolation layer and sacrificial plugs, in accordance with an embodiment of the present invention.

In one or more embodiments, backside ILD layer 340 can be formed on the exposed shallow trench isolation regions 180, sacrificial plug(s) 240, and sacrificial fill region(s) 260. In various embodiments, the backside ILD layer 340 can be an electrically insulating, dielectric material (e.g., $SiO_x$) formed by a blanket deposition.

Figure 18:
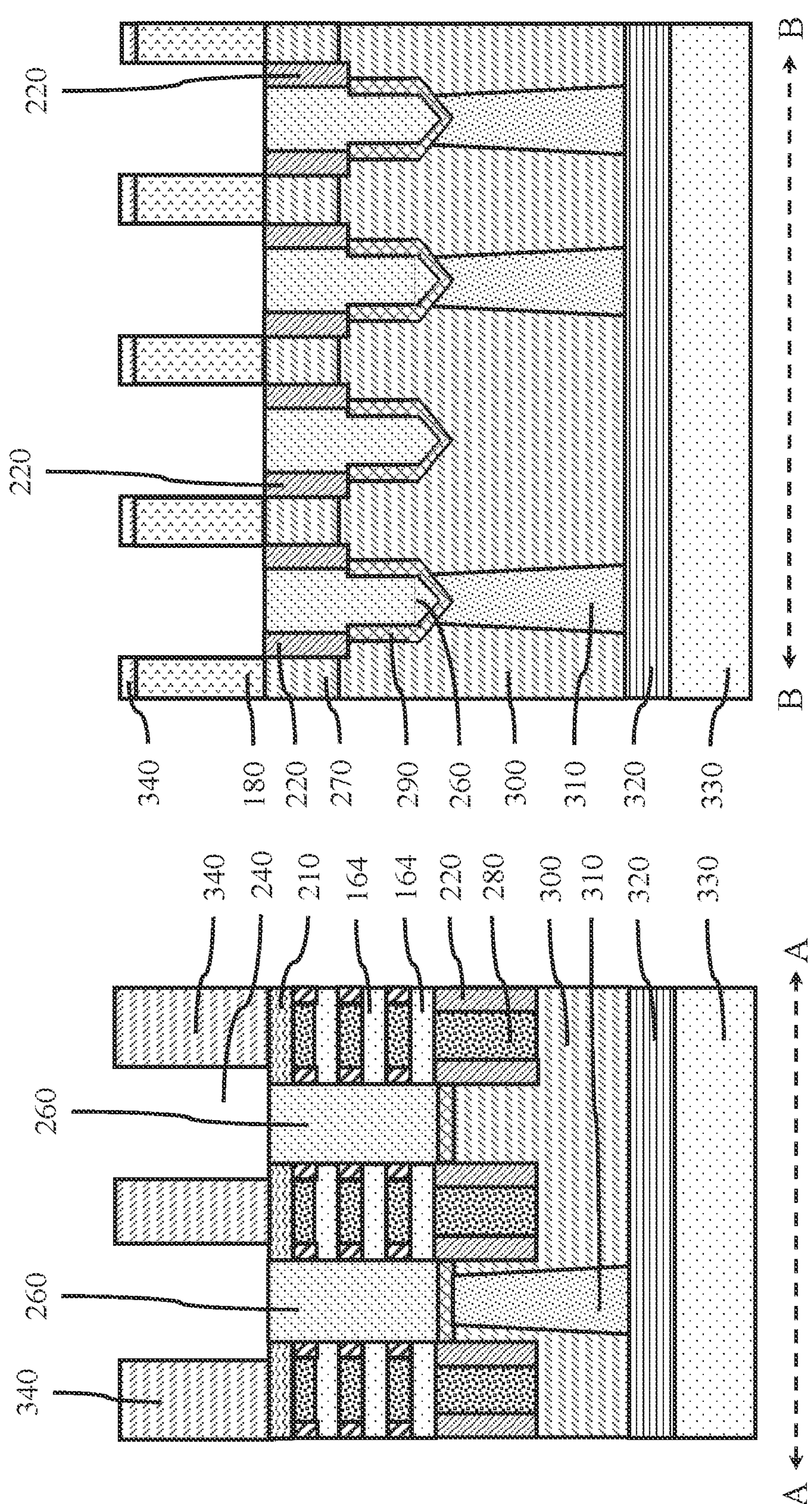
FIG. 18 shows perpendicular cross-sectional side views having the sacrificial plugs removed to expose a backside of the source/drains and insulating sidewalls, in accordance with an embodiment of the present invention.

FIG. 18 includes perpendicular cross-sectional side views showing removal of the sacrificial plugs to expose a backside of the source/drains and insulating sidewalls, in accordance with an embodiment of the present invention.

In one or more embodiments, the sacrificial plugs 240 can be removed, for example, using a selective isotropic etch to expose the sidewalls of the backside ILD layer 340 and backside of the source/drains 260.

In one or more embodiments, a selective isotropic etch can be used to increase the size of the openings in the backside ILD layer 340 formed by removal of the sacrificial plugs 240, where removal of an additional portion of the backside ILD layer 340 can expose the surfaces of the insulating sidewalls 220 and a portion of the buried insulating layer 210.

Figure 19:
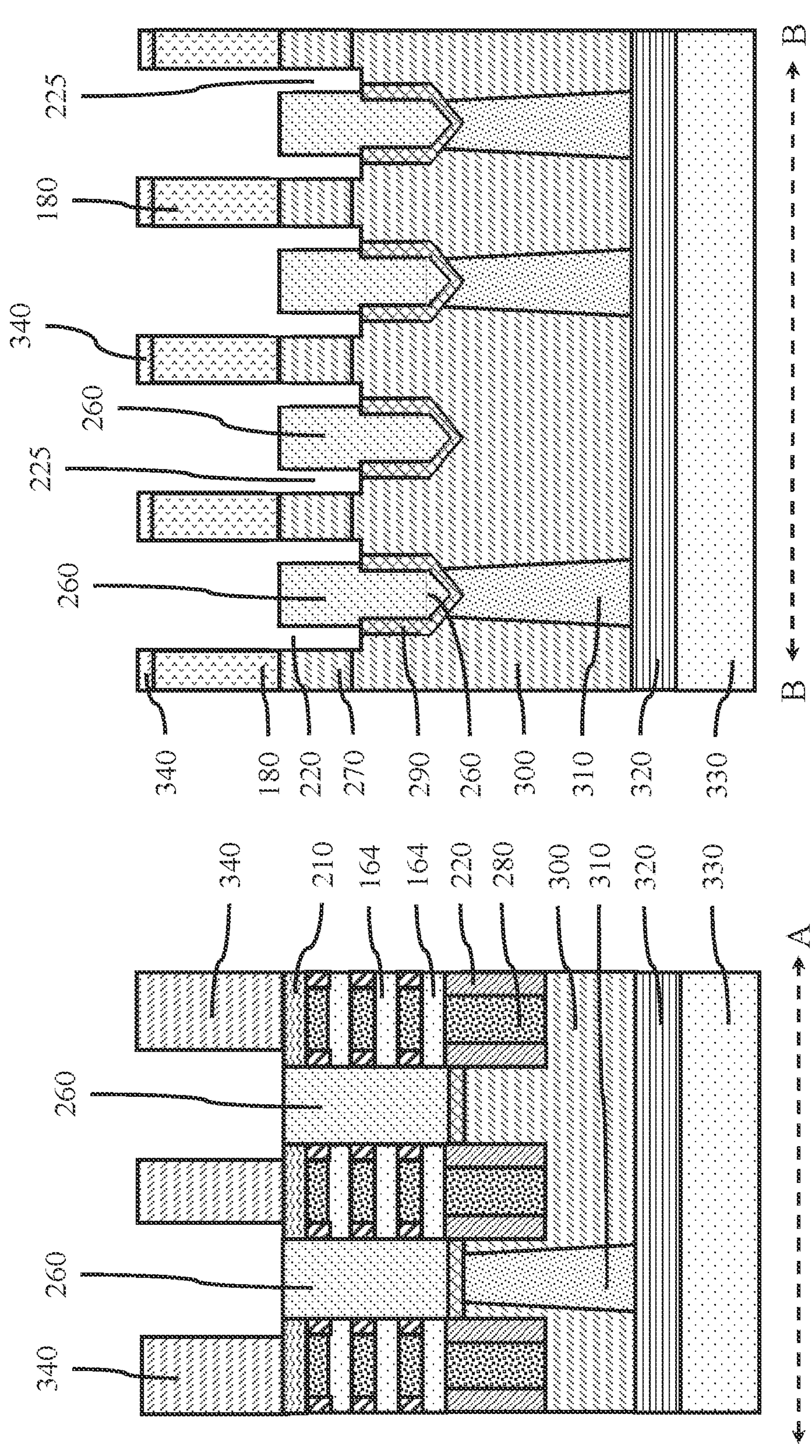
FIG. 19 shows perpendicular cross-sectional side views having the insulating sidewalls removed to form contact trenches, in accordance with an embodiment of the present invention.

FIG. 19 includes perpendicular cross-sectional side views showing removal of the insulating sidewalls to form contact trenches, in accordance with an embodiment of the present invention.

In one or more embodiments, the insulating sidewalls 220 can be removed from around the source/drains 260 to form gaps 225 between the first interlayer dielectric (ILD) layer 270 and the source/drains 260. The removal of the insulating sidewalls 220 and the formation of the gaps 225 can expose a portion of the metal-silicide layer 290 on the source/drains 260.

Figure 20:
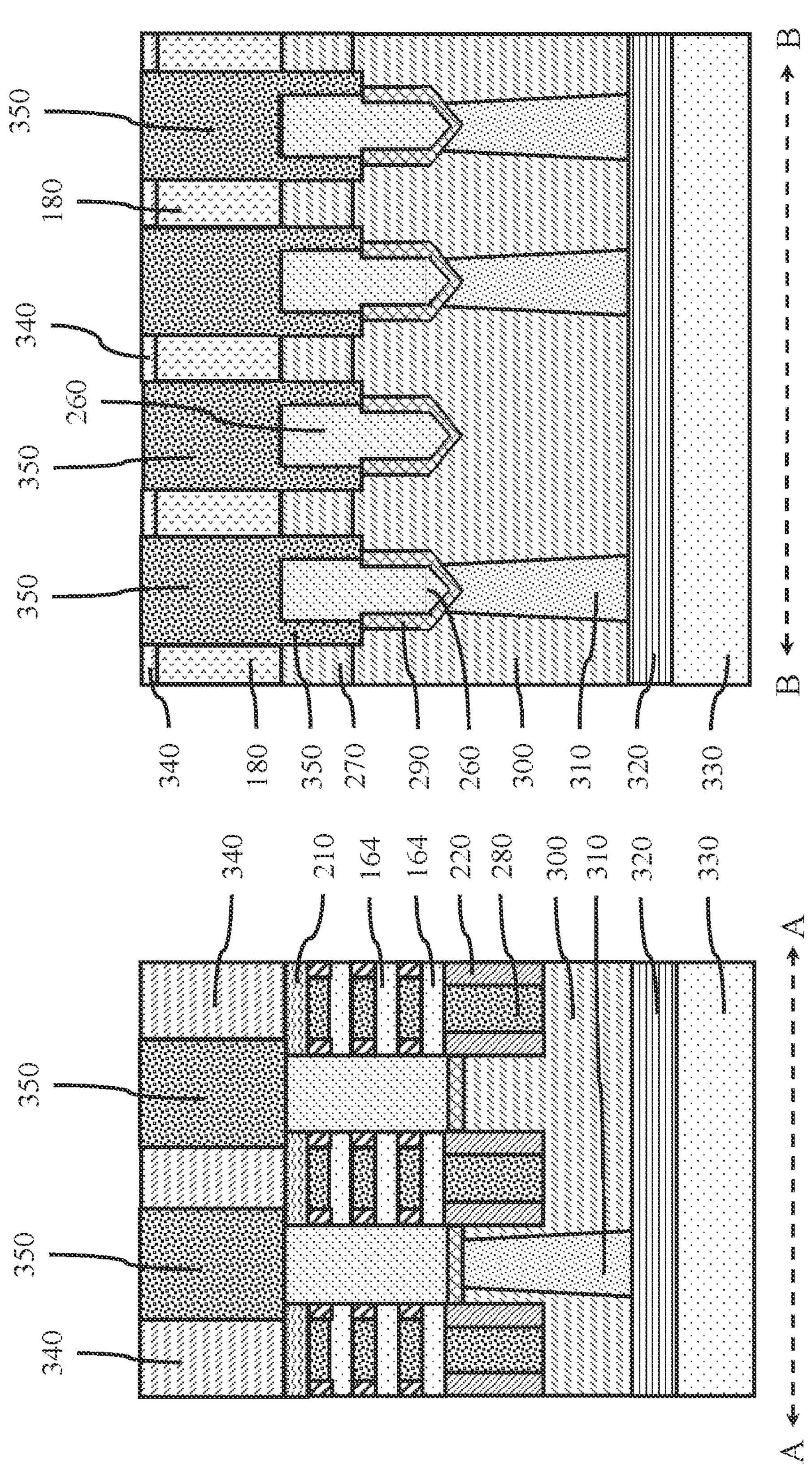
FIG. 20 shows perpendicular cross-sectional side views having backside conductive contacts formed in the contact trenches, in accordance with an embodiment of the present invention.

FIG. 20 includes perpendicular cross-sectional side views showing formation of the backside conductive contacts in the contact trenches, in accordance with an embodiment of the present invention.

In one or more embodiments, backside conductive contacts 350 can be formed in the gaps 225 and spaces above the source/drains 260, where the backside conductive contacts 350 can be formed by a blanket deposition (e.g., CVD) followed by a CMP to provide a smooth, flat surface. The backside conductive contact 350 can be on and in electrical contact with the source/drain 260 and the metal-silicide layer 290 on the source/drains 260, which can form a full wrap-around contact surrounding at least a partial length of the source/drain 260.

In various embodiments, the backside conductive contacts 350 can be a silicide layer (such, e.g., NiSi, TiSi, NiPtSi, CoSi and combinations thereof or other metal silicides) that wraps around S/D regions 260 follow by a conductive contact deposition. The conductive contact materials can include, e.g., copper (Cu), tungsten (W), tantalum (Ta), molybdenum (Mo), cobalt (Co), ruthenium (Ru) and combinations thereof. In one embodiment, a metal adhesion layer can be formed, such as TiN, prior to formation of the backside conductive contacts 350 and/or prior to the conductive metal fill.

Figure 21:
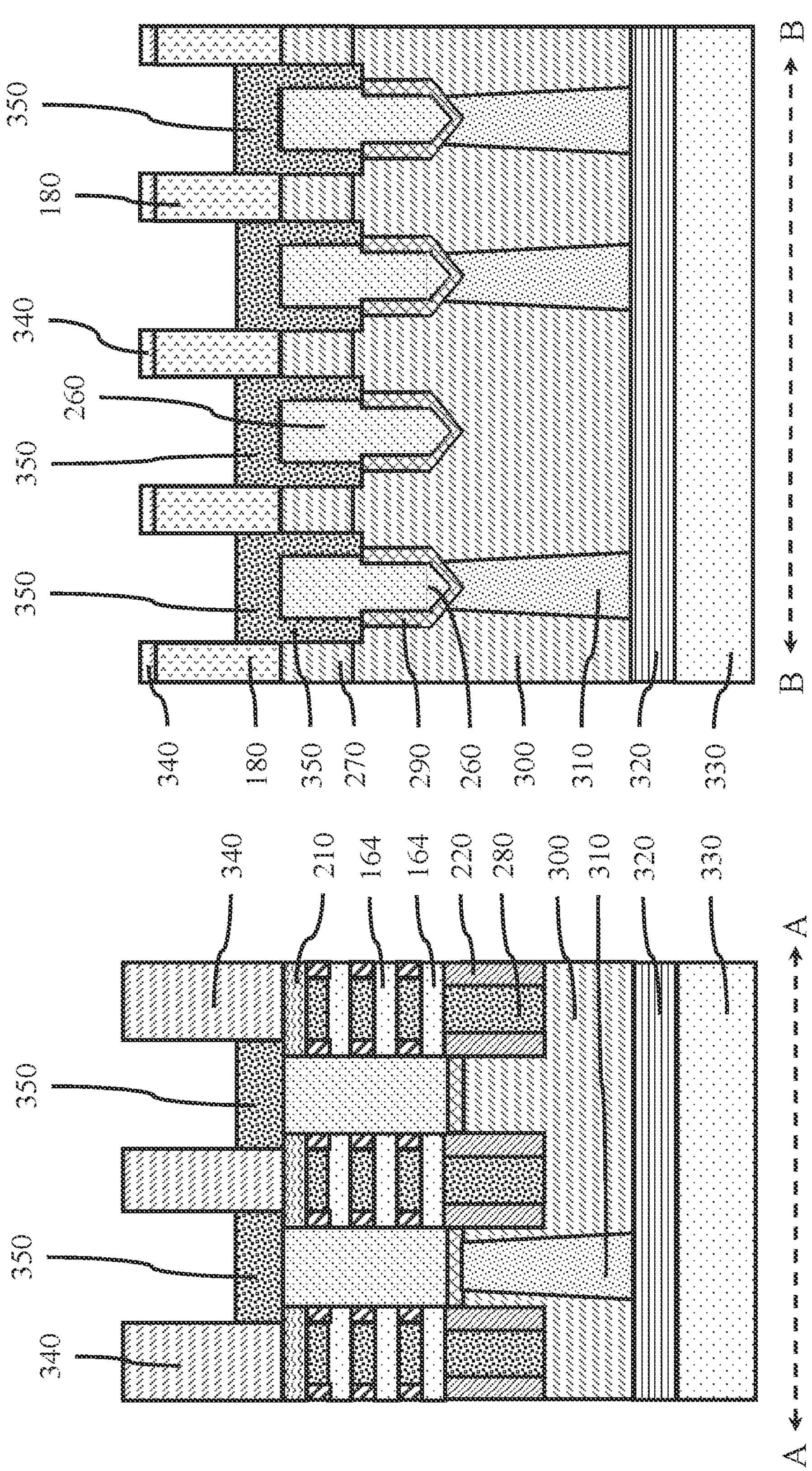
FIG. 21 shows perpendicular cross-sectional side views having a recess of the backside conductive contacts in the contact trenches, in accordance with an embodiment of the present invention.

FIG. 21 includes perpendicular cross-sectional side views showing recessing of the backside conductive contacts in the contact trenches, in accordance with an embodiment of the present invention.

In one or more embodiments, a portion of the backside conductive contacts 350 can be removed using a selective etch to recess the backside conductive contacts 350 below the surface of the backside ILD layer 340.

Figure 22:
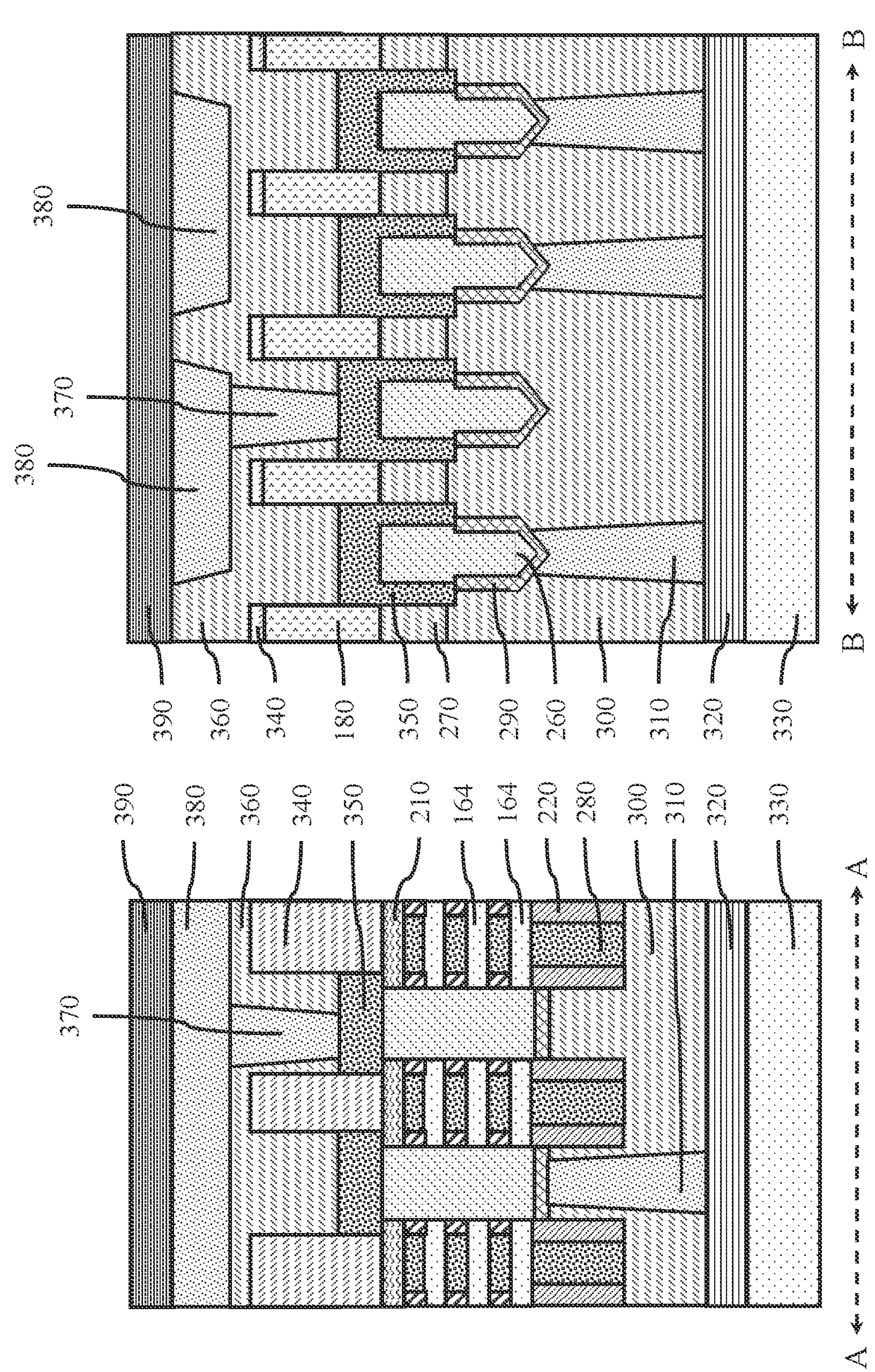
FIG. 22 shows perpendicular cross-sectional side views having a backside power rail, backside vias, and backside power delivery network (BSPDN) to the backside conductive contacts, in accordance with an embodiment of the present invention.

FIG. 22 includes perpendicular cross-sectional side views showing formation of the backside power rail, backside vias, and backside power delivery network (BSPDN) to the backside conductive contacts, in accordance with an embodiment of the present invention.

In one or more embodiments, a dielectric fill layer 360 can be formed on the recessed backside conductive contacts 350, where the dielectric fill layer 360 can be formed by a blanket deposition. The dielectric fill layer 360 can cover the backside ILD layer 340 and the shallow trench isolation regions 180.

In one or more embodiments, a backside via 370 can be formed in the dielectric fill layer 360 through masking, lithography, etching and metal deposition. The backside via 370 can be on and in electrical contact with the backside conductive contacts 350.

In one or more embodiments, one or more backside power rails 380 can be formed in the dielectric fill layer 360, where the backside power rails 380 can be formed through masking, lithography, etching and metal deposition. The backside power rails 380 can be on and in electrical contact with the backside vias 370.

In one or more embodiments, a backside power delivery network (BSPDN) 390 can be formed on and to the backside power rails 380, where a backside power rail 380 can connect to a backside via 370 and the backside conductive contacts 350, to the source/drains 260 to provide a voltage/current.

The backside vias 370 can include a metal liner (such as, e.g., TiN, TaN) and a metal fill, e.g., copper (Cu), aluminum (Al), ruthenium (Ru), cobalt (Co), tungsten (W), and combinations thereof or other suitable materials. The backside power rails 380 can include a metal liner (such as, e.g., TiN, TaN) and a metal fill, e.g., copper (Cu), aluminum (Al), ruthenium (Ru), cobalt (Co), tungsten (W), and combinations thereof or other suitable materials.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one elements or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:

a source/drain having a height, a length, and a width; and a full wrap-around contact surrounding at least a partial length of the source/drain, wherein the full wrap-around contact includes a partial front-side wrap-around contact from a front side of a substrate and a partial back-side wrap-around contact from a back side of the substrate, wherein the partial back-side wrap-around contact is directly on a backside surface of the source/drain.

2. The semiconductor device of claim 1, wherein at least a portion of the full wrap-around contact comprises a metal-silicide layer on the source/drain and extending over insulating sidewalls adjacent the source/drain.

3. The semiconductor device of claim 2, wherein a portion of the metal-silicide layer separates the partial front-side wrap-around contact from the source/drain.

4. The semiconductor device of claim 3, further comprising one or more semiconductor nanosheet layer segments adjoining the source/drain.

5. The semiconductor device of claim 4, wherein a portion of the partial back-side wrap-around contact extends in a gap between a first interlayer dielectric layer and the source/drain.

6. The semiconductor device of claim 5, further comprising a replacement metal gate structure on the one or more semiconductor nanosheet layer segments, and an inner spacer separating the replacement metal gate structure from the source/drain.

7. The semiconductor device of claim 6, wherein the metal-silicide layer comprises nickel platinum silicide (NiPtSi).

8. A backside power connection device, comprising:

a back-end-of-line metallization layer on a carrier wafer;

an interlevel dielectric layer on the back-end-of-line metallization layer;

a source/drain contact in the interlevel dielectric layer, and in electrical contact with the back-end-of-line metallization layer;

a source/drain electrically connected to the source/drain contact;

a replacement metal gate structure electrically separated from the source/drain;

a metal-silicide layer on the source/drain;

a backside interlevel dielectric layer; and a backside conductive contact extending through an opening in the backside interlevel dielectric layer, the opening exposing a backside of the source/drain, the backside conductive contact being on and in electrical contact with the source/drain and the metal-silicide layer.

9. The backside power connection device of claim 8, further comprising a backside via on and in electrical contact with the backside conductive contact, a backside power rail on and in electrical contact with the backside via, and a backside power delivery network (BSPDN) on and to the backside power rail.

10. The backside power connection device of claim 8, further comprising one or more semiconductor nanosheet layer segments adjoining the source/drain.

11. The backside power connection device of claim 10, wherein the replacement metal gate structure is on the one or more semiconductor nanosheet layer segments adjoining the source/drain.

12. The backside power connection device of claim 9, wherein a portion of the backside conductive contact is recessed below a surface of the backside interlevel dielectric layer.

13. The backside power connection device of claim 12, further comprising a dielectric fill layer on the backside conductive contact and the backside interlevel dielectric layer, wherein the backside via and the backside power rail are in the dielectric fill layer.

14. A method of forming a semiconductor device, the method comprising:

forming a source/drain having a height, a length, and a width; and forming a full wrap-around contact surrounding at least a partial length of the source/drain, wherein forming the full wrap-around contact includes:

forming a partial front-side wrap-around contact from a front side of a substrate; and forming a partial back-side wrap-around contact from a back side of the substrate directly on a backside surface of the source/drain.

15. The method of claim 14, further comprising forming a metal-silicide layer on the source/drain, wherein the metal-silicide layer extends over insulating sidewalls adjacent the source/drain, and wherein at last a portion of the full wrap-around contact comprises a metal-silicide layer.

16. The method of claim 15, wherein a portion of the metal-silicide layer separates the partial front-side wrap-around contact from the source/drain.

17. The method of claim 16, wherein one or more semiconductor nanosheet layer segments adjoin the source/drain.

18. The method of claim 17, wherein a portion of the partial back-side wrap-around contact extends in a gap between a first interlayer dielectric layer and the source/drain.

19. The method of claim 18, wherein a replacement metal gate structure is on the one or more semiconductor nanosheet layer segments, and an inner spacer separates the replacement metal gate structure from the source/drain.

20. The method of claim 19, wherein the metal-silicide layer comprises nickel platinum silicide (NiPtSi).

* * * * *